(12) United States Patent
Gladkova et al.

(10) Patent No.: US 7,907,784 B2
(45) Date of Patent: Mar. 15, 2011

(54) SELECTIVELY LOSSY, LOSSLESS, AND/OR ERROR ROBUST DATA COMPRESSION METHOD

(75) Inventors: Irina Gladkova, West Nyack, NY (US); Michael Grossberg, New York, NY (US); Leonid Roytman, Port Washington, NY (US)

(73) Assignee: The United States of America as represented by the Secretary of the Commerce, Washington, DC (US)

( * ) Notice: Subject to any disclaimer, the term of this patent is extended or adjusted under 35 U.S.C. 154(b) by 917 days.

(21) Appl. No.: 11/774,704

(22) Filed: Jul. 9, 2007

(65) Prior Publication Data

US 2009/0018801 A1 Jan. 15, 2009

(51) Int. Cl.
*G06K 9/36* (2006.01)
(52) U.S. Cl. ......... 382/232; 382/254; 382/263; 382/162
(58) Field of Classification Search .............. 382/232, 382/254, 263, 162; 358/448; 380/269; 342/457, 342/357.02; 434/262, 272; 455/456.2
See application file for complete search history.

(56) References Cited

U.S. PATENT DOCUMENTS

| | | | |
|---|---|---|---|
| 5,400,371 A | 3/1995 | Natarajan | |
| 5,825,830 A | 10/1998 | Kopf | |
| 6,023,525 A * | 2/2000 | Cass | ............................ 382/162 |
| 6,546,146 B1 | 4/2003 | Hollinger | |
| 6,661,924 B1 | 12/2003 | Abe | |
| 6,701,021 B1 | 3/2004 | Qian | |
| 6,724,940 B1 | 4/2004 | Qian | |
| 6,804,400 B1 | 10/2004 | Sharp | |
| 7,261,565 B2 * | 8/2007 | Chosack et al. | .............. 434/262 |
| 7,433,696 B2 * | 10/2008 | Dietrich et al. | ............ 455/456.2 |
| 2002/0159617 A1 | 10/2002 | Hu | |
| 2004/0008896 A1 | 1/2004 | Suzuki | |
| 2004/0093364 A1 | 5/2004 | Cheng | |
| 2004/0102906 A1 | 5/2004 | Roder | |
| 2005/0036661 A1 | 2/2005 | Viggh | |
| 2005/0047670 A1 | 3/2005 | Qian | |
| 2006/0038705 A1 | 2/2006 | Brady | |
| 2006/0251324 A1 | 11/2006 | Bachmann | |

FOREIGN PATENT DOCUMENTS

| | | |
|---|---|---|
| EP | 1209917 A2 | 5/2002 |
| EP | 1209627 A2 | 5/2006 |
| WO | WO2005022399 A2 | 3/2005 |

OTHER PUBLICATIONS

D. Salomon, Data Compression: The Complete Reference, Springer, New York, 2004 (third edition).

(Continued)

*Primary Examiner* — Anh Hong Do
(74) *Attorney, Agent, or Firm* — Robert Platt Bell

(57) ABSTRACT

Lossless compression techniques provide efficient compression of hyperspectral satellite data. The present invention combines the advantages of a clustering with linear modeling. A number of visualizations are presented, which help clarify why the approach of the present invention is particularly effective on this dataset. At each stage, the algorithm achieves an efficient grouping of the data points around a relatively small number of lines in a very large dimensional data space. The parametrization of these lines is very efficient, which leads to efficient descriptions of data points. The method of the present invention yields compression ratios that compare favorably with what is currently achievable by other approaches.

23 Claims, 23 Drawing Sheets

OTHER PUBLICATIONS

H.H. Aumann, M.T. Chahine, C. Gautier, M. D. Goldberg, E. Kalnay, L.M. McMillan, H. Revercomb, P.W. Rosenkranz, W.L. Smith, D.H. Staelin, L.L. Strow, and J. Susskind, "AIRS/AMSU/HSB on the Aqua Mission: design, science objectives, data products, and processing systems," IEEE Trans. Geosci. Remote Sensing 41(2), pp. 253-264, 2003.

M. Goldberg, Y. Qu, L. M. McMillan, W. Wolf, L. Zhou, and M. Divakarla, "AIRS near-real-time products and algorithms in support of operational numerical weather prediction," IEEE Transactions on Geoscience and RemoteSensing 41, pp. 379-389, 2003.

D. Huffman, "A method for the construction of minimum redundancy codes," Proc of IRE 40, pp. 1098-1101, 1952.

C. E. Shannon, "Communications in the presence of noise," Proc. of IRE 37, pp. 10-21, 1949.

C. E. Shannon, "A Mathematical Theory of Communication," The Bell System Technical Journal 27, pp. 379-423, 623-656, 1948.

H. H. Aumann, D.T. Gregorich, S.L. Gaiser, D.F. Hagan, T.S. Pagano, L. Strow, and D. Ting, "AIRS level 1b algorithm theoretical basis document (ATBD) part 1 (IR)," Nov. 10, 2000.

G. Davis and A. Nosratinia, "Wavelet-based image coding: An overview," Applied and Computational Control, Signals, and Circuits 1(1), 1998.

R. O. Duda, P. E. Hart, and D. G. Stork, Pattern Classification, S.E, Wiley Interscience, 2000.

* cited by examiner

SELECTIVELY LOSSY, LOSSLESS, AND/OR ERROR ROBUST DATA COMPRESSION METHOD

STATEMENT OF GOVERNMENT INTEREST

The research that led to the development of the present invention was sponsored by the National Oceanic and Atmospheric Administration's (NOAA's) National Satellite Service (NESDIS). NOAA is a part of the U.S. Department of Commerce, a component of the U.S. Federal government. The United States Government has certain rights in this invention.

FIELD OF THE INVENTION

The present invention is directed toward a new algorithm for obtaining a very high level of lossless compression of data. The present invention has particular application to lossless, lossy and progressive modes of compression of Hyperspectral Grating Spectrometer Sounder Earth Science Atmospheric data.

BACKGROUND OF THE INVENTION

Techniques are known in the art for compressing data for transmission of computer signals, television signals, data transmission and storage, and the like. Scientists may use imaging satellite data to study atmospheric effects, global warming, and other weather and geological, geographic or other phenomena. Such data may be produced from an orbiting satellite or other data source, and include data from a range of spectra, at a particular time, or over a time period. In the preferred embodiment, such data may include Hyperspectral Grating Spectrometer Sounder Earth Science Atmospheric data.

Today, there are two main competing technologies for implementing hyperspectral sounders for Earth and deep space science measurements. These are the Grating Spectrometer and the Fourier Transform Spectrometer (FTS). The FTS is principally implemented in the form of a Michelson Interferometer. The terms hyperspectral and ultraspectral refer to the ability of these instruments to break up the measured radiant energy into thousands of spectral channels. The AIRS sensor for example has 2378 spectral channels. The term "sounder" refers to temperature and water vapor being measured as functions of height. The Grating and FTS hyperspectral sounder sensors also measure clouds, trace gases in the atmosphere (e.g., ozone, carbon monoxide, carbon dioxide, methane, sulfur dioxide, and the like), and may detect suspended dust particles (aerosols).

Hyperspectral spectrometer sounder data comprises measurements from an atmospheric scene across space and spectrum. Grating spectrometer sounder Earth science atmospheric data is a very specific class of measured data having fairly unique characteristics across its space and spectrum. Hyperspectral sounders are becoming an increasingly important instrument for world governments for monitoring the Earth's atmosphere from satellite and airborne platform (e.g., planes, unmanned aerial vehicles (UAVs), balloons, and the like) and are only recently being introduced for Earth science and deep space observations. They are powerful sensors for measuring atmospheric science data, but are characterized by very large data rates.

The recent October 2006 launched European Union meteorology satellite (EUMETSAT) METOP satellites Infrared Atmospheric Sounding Interferometer (IASI) sensor has a data rate 45 Mbps before any processing. The IASI is a Michelson FTS sensor. The planned NOAA GOES R HES sounder sensor (either a Grating or Michelson FTS type) in its concept phase had an estimated data rate of 65 Mbps. A very high data rate is one the characteristics of today's emerging hyperspectral Earth science atmospheric sounders. These large hyperspectral Sounder data rates present tremendous challenges for transmission, computation, storage, distribution and archiving. Hence data compression is required. For the Lossless mode, obtaining the highest possible compression ratio (CR) is very desirable for it may mean a greater level of possible data transmission, and reduced science data archive burden.

The current recommendations from the international Consulting Committee for Satellite Data Standards (CCSDS) for data compression, 121.0-B-1 and 122.0-B-1, may be applied to hyperspectral spectrometer data, but give lower Lossless compression ratios when applied to grating spectrometer sounder data compared to this new algorithm, as do other compression standards and popularly used compression algorithm algorithms (e.g., JPEG, JPEG 2000, SPIHT, EZW). Many major space agencies across the world, including NASA, NOAA, CSA, ESA, EUMETSAT, and CNES, are recognizing that current conventional compression techniques applied to Earth science sensor data are not capable of achieving a maximum CR.

Hyperspectral imaging is becoming an increasingly important tool for monitoring the earth and its environment from spaceborne and airborne platforms. Hyperspectral imaging data comprises measurements from a scene, which span both space and spectrum. These measurements differ from conventional imaging in that possibly thousands of spectral channels are measured. They differ from spectrometer measurements in that the measurements span both a spatial and often temporal extent.

Due to the resolution as well as the large spectrum of such data, a large amount of data may be transmitted from a satellite (or other data source) to an Earth station. Compression techniques are known in the art for compressing such data for transmission. The following references, all incorporated herein by reference, disclose techniques for compressing Hyperspectral and other imaging data:

U.S. Pat. No. 6,724,940 (Qian, Shen-En) discloses a hyperspectral image datacube encoding method for an imaging spectrometer, using vector quantization. Appropriate codebooks are determined for selecting code vectors for encoding spectral vector of hyperspectral data iteratively.

U.S. Pat. No. 6,701,021 (Qian, Shen-En) discloses an image data encoding method, which encodes an error vector of difference data until the control error of difference data is smaller than given threshold. Like the '940 patent, here codebooks are used, but a first "small" codebook is first applied, and then successive "small" codebooks applied to that data. The '940 Patent applies different codebooks until a certain threshold is reached, whereas the '021 Patent applies successive "small" codebooks until a threshold is reached.

U.S. Pat. No. 6,546,146 (Hollinger, Allan B.) discloses a 3D hyper-spectral image data compression system. The '146 Patent also uses a codebook technique and recites how data may be viewed without decoding the entire datacube.

Published U.S. Patent Application No. 2005/0047670A1 (Qian, Shen-En) discloses a Code vector trainer for real-time wide-band compressor, which assigns each input data vector to one of partitions based on best match code vector determined for each input vector.

Published European Application EP1209627A2 (Qian, Shen-en) discloses a hyperspectral image datacube encoding method for imaging spectrometer, which involves determining appropriate codebooks for selecting code vectors for encoding spectral vector of hyper-spectral data iteratively. This is the European equivalent of the '940 Patent cited above.

Published European Application EP1209917A2 (Qian Shen-en;) discloses an image data encoding method involving encoding error vectors of difference data until the control error of difference data is smaller than given threshold. This is the European equivalent of the '021 Patent cited above.

Published Patent Cooperation Treaty (PCT) Application WO05022399A2 (QIAN, Shen-En) discloses a code vector trainer for real-time wide-band compressor, assigns each input data vector to one of partitions based on best match code vector determined for each input vector. This is the PCT equivalent of the Published U.S. Application 2005/0047670 cited above.

U.S. Pat. No. 6,804,400 (Sharp, Mary;) discloses a hyperspectral image spectral data compressing a method for use in a land-observing satellite, which involves representing image pixels as a combination of end components set-selected based on image noise level given by an image noise calculator. A set of end members are identified based upon their correlation with the spectral signature of the pixels. A first pixel is processed as a combination of the set of endmembers, and the process is repeated iteratively.

Published U.S. Patent Application No. 2006/0251324A1 (Bachmann, Charles M) discloses a method for exploiting the nonlinear structure of hyperspectral imagery, which employs a manifold coordinate system that preserves geodesic distances in the high-dimensional hyperspectral data space.

Published U.S. Patent Application No. 2005/0036661A1 (Viggh, Herbert E. M.) discloses a surface spectral reflectance measuring process for remote sensing imagery, which involves finding estimates of noise in set of image data and amount of image signal lost due to atmospheric effects based on prior reflectance information.

Published U.S. Patent Application No. 2006/0038705A1 (Brady, David J.;) discloses a method for compressively sampling optical signal in spectroscopy, which involves simultaneously detecting signals passed through optical component and selecting transmission function so that detected signal values is below estimated signal values.

Published U.S. Patent Application No. 2004/0093364A1 (Cheng, Andrew F.) discloses a method for compressing data, such as time-series data, which involves approximating data using Chebyshev polynomials.

U.S. Pat. No. 6,661,924 (Abe, Nobuaki;) discloses an image compression apparatus, which selects a conversion mode with least number of symbols as optimum mode and performs encoding of image data, based on selected mode.

Published U.S. Patent Application No. 2002/0159617A1 (Hu, Lin-Ying) discloses a gradual deformation of an initial distribution of geological objects formed by a stochastic model of the object type involves gradual modification of a uniform random vector defining the position of the object in terms of density.

Published U.S. Patent Application No. 2004/0008896A1 (Suzuki, Norihisa;) discloses a video stream compressing and decompressing process for computer environment, which involves providing fast preprocessing units for preprocessing video frames, and compressing video frames using Huffman coding.

U.S. Pat. No. 5,400,371 (Natarajan, Balas K.) discloses a random noise filtering using data compression, distributing non-random noise-free signals using random noise by measuring difference between two signals and selecting measure of complexity for signals.

Published U.S. Patent Application No. 2004/0102906A1 (Roder, Heinrich) discloses a mass spectrometer system for collecting and processing raw data, which has a computing unit to receive raw data from data acquisition unit and transform the raw data into transformed data having hierarchical format for use at several resolutions.

U.S. Pat. No. 5,825,830 (Kopf, David A.) discloses a variable code width data compression method for medical images having differential data output in code widths that may be varied and altered by set of common rules in encoder and decoder.

The above-cited Patents and pending applications disclose techniques for compressing Hyperspectral data. However, these Prior Art compression techniques do not compress the data in a lossless manner. During compression and transmission, some resolution of data may be lost. During analysis, scientists may require that the data received be at the same resolution as originally measured. In the Prior Art, such requirements may result in low compression ratios, which in turn limits the amount of data, which may be transmitted from a satellite or other data source.

The greatly expanded volume of data provided by these instruments presents tremendous challenges for transmission, computation, storage, distribution and archiving. The current recommendations from the international Consulting Committee for Satellite Data Standards (CCSDS) for data compression, 121.0-B-1 and 122.0-B-1, may be applied to hyperspectral data, but give low compression ratios. All the major space agencies across the world, including NASA, NOAA, CSA, ESA, CNES, and ASI have recognized that the current techniques are not adequate, and hence novel methods optimized for hyperspectral imaging data may be employed. Thus, a requirement remains in the art for a compression technique for Hyperspectral data (or other data), which may have a selective compression ratio, and provide improved compression in lossless, lossy or progressive modes of compression.

SUMMARY OF THE INVENTION

The present invention is directed toward a new algorithm for obtaining a very high level of lossless compression of Hyperspectral Grating Spectrometer Sounder Earth Science Atmospheric data. Lossless compression algorithms seek to create a compressed representation of the data so that the corresponding decompression algorithm allows a perfect reconstruction (completely free of errors) of the original data from the compressed data. This compression is essential since many scientific applications using Sounder Data require lossless reconstruction of the original data to obtain the most accurate results. For scientific and visualization applications for which a good approximation of the original data, lossy compression may be used. Lossy compression allows small amounts of error in order to dramatically reduce the size of the compressed representation. Typically compression ratios (CR) may be orders of magnitude larger when using lossy compression rather than lossless compression. Since the requirements vary across applications and settings for which sounder data is used, this invention describes a family of compression algorithms, which have Lossless, Lossy, and Progressive modes of compression.

When the compression-decompression algorithm is operated in Lossless mode, the original data will be perfectly reconstructed without error. In data archiving or transmission across a fiber optic network, errors may be assumed to be negligible. In wireless data communication, errors will be introduced by noise in the communication system. In this case the algorithm also has among its features a new approach for robust error containment compressed data streams. The compression algorithm is designed such that when it is integrated into satellite system use, it synergistically works with current advanced forms of error correction (channel coding) technology such as advanced forward error correction (FEC) coding. Examples of the types of (FEC) codes that work with the new compression algorithm include Turbo product codes (TPC), and Low Density Parity Checks (LDPC). When the compression algorithm utilizes FEC to make it robust to noisy transmissions, the compression ratio it may achieve is somewhat reduced. When this feature is not needed the algorithm may be set to disable the error containment in order to maximize the compression ratio when used on noise free transmission systems.

To illustrate the algorithm's performance, the algorithm has been evaluated on hyperspectral Grating Spectrometer Sounder atmospheric data in its Lossless mode, such as to the NASA Atmospheric Infrared Sounder (AIRS) sensor, provides when the error protection feature for satellite use is not used, a Lossless compression ratio (CR) of about 3.7 to 1. When it is applied in its Lossless mode with the error protection feature for high noise wireless satellite in use, a lower CR of about 3.1 to 1 is typically obtainable.

The compression algorithm is designed to exploit properties of hyperspectral/ultraspectral sounders that are known for grating spectrometer design. This Earth science data properties-driven approach allows the present invention to achieve superior results over generic compression algorithm methods.

There are a number of significant features of the present invention. One feature is that the compression algorithm uses a form of adaptive clustering. Another feature is that the present invention is directed at compression of grating spectrometer sounder Earth science data. An example of such data would be the NASA AIRS sensor. Yet another feature is that the present invention incorporates error robustness for transmission over noisy channels such as satellite transmissions.

The algorithm has a number of options. First, it may be used with or without the error robustness. When used for satellite data transmission with the error robustness option, the expected compression ratio is lowered about 15% but makes it possible to prevent an entire packet being lost. This usually happens when channel decoding (like Turbo Coding or LDPC) fails to correct errors caused by noisy channels. When used without the error robust option, a higher lossless compression ratio is achieved. Such an application might be used for data archiving or fiber optic terrestrial line transmission.

In a second option, the algorithm has a lossless mode. The lossless mode is a lossless compression algorithm primarily, but has an option that allows it to be operated in a lossy mode to varying degree. In a third option, the algorithm has a progressive compression option. The progressive compression mode allows the user to decide at which point the quality of the sounder image satisfies his needs. This feature might be very useful for scientists and researchers that will have an option to stop the transmission of a very large file (that will take a lot of time and create network traffic) after a quick inspection.

The compression algorithm of the present invention is based on approximating the data measured as a piecewise smooth and a stochastic component. Before separating the data into components the data is restructured to facilitate compression. The piecewise smooth component structure of the data appears as dependencies in measurements that differ both in space and spectrally. Conversely, the stochastic component appears to be independent between measurements. Hence, the approach of the present invention is to construct a model which fits a piecewise smooth low parameter description of the data, and subtracts it from the measured data. If the fitting captures all the important dependencies, the residual values are independent. These residuals may then be compressed optimality using entropy encoding.

A simplistic way to capture the piecewise smooth variations in the block of hyperspectral sounder imagery data is to approximate the data as a function on the spatial-spectral domain in R3. This does not work well because despite strong dependencies in both spatial and spectral domain, neighboring values need not vary smoothly. In order to capture the complexity of the dependencies the data is broken up into parts so that the values in each part contain all correlations which contribute significantly to compression of the set of parts, the parts are essentially independent in that a partition into larger parts does not lead to significantly greater compression, and there are enough parts within the sample to obtain reliable statistics to exploit the redundancy.

The first of the two above-mentioned goals are typically at odds with the last goal. For example, if the data is partitioned into disjoint uniform blocks, then the first goal is best achieved by taking large blocks. However, as the blocks become too large, there may be two few blocks to capture statistical redundancy. Hence, the data is partitioned partition into subportions of the original data to maximize the overall compression ratio. A part need not simply be a subset of raw measurements. In general, the raw measurements are transformed into a set of $n_i$ dimensional feature vectors. Each coordinate of a feature vector is an output of one of n filters applied to the data. To obtain all feature vectors, the collection of n filters is translated in space and spectrum. Hence, breaking the data into a set of uniform blocks is a special case. For this case, the nth filter is the nth measurement within the block. The each feature vector contains related spectral-spatial information.

Dependencies of spectral spatial information are manifest by feature vectors lying close to a low dimensional manifold within the feature space. In other words, spectral-spatial dependencies make it possible to smoothly index feature vectors compactly with a small number of parameters called local coordinates. In this way, one may store the parameters of local coordinates, and the low parameter local coordinates for each data point. This results in a large reduction in the amount of data that needs to be stored in order to approximate the original data.

Once the algorithm of the present invention determines these parameters, the reconstructed approximation achieves lossy compression of the data. For example, in one embodiment of the algorithm of the present invention, to find the model parameters is to simultaneously cluster and fit a set of lines to the feature vectors. Due to the significant correlations present in the data, a very little of the total volume of possible feature space is occupied. The algorithm of the present invention rapidly determines a coarse estimation of the distribution in feature space by examining and clustering significant bit planes and applying a generalization of an oct-tree to determine hypercubes with large occupancies. This is followed by an initial clustering of the data using a k-means algorithm. For each cluster a mathmatical model is determined which approximates the data. In one embodiment the models are lines whose parameters are computed using standard linear regression. Once a set of lines is chosen, the feature vectors are clustered based on which line is closest using the Euclidean distance.

The steps of clustering and fitting are iterated to achieve a locally optimal joint estimation. The use of lines, as a mathematical model, to cluster points in the feature space is arbitrary. The data will dictate which local parameterization is most efficient. For some data sets, fitting m-dimensional hyper-planes using linear regression may be the most effective. The m to be used is determined by maximizing the total compression ratio. This may be found by starting from m=1 and increasing m as long as the compression ratio increases. The feature vectors may also be described more efficiently by a more general mathematical model such as a non-linear manifold.

The algorithm of the present invention may accommodate more complex representations of the data manifold by embedding the feature space into a larger feature space via a non-linear (e.g., polynomial) map. Increasing the flexibility of the surface that models the manifold in feature space will result in better fitting of the feature vectors. This reduces the size of the residual errors, which make up the stochastic component. The reduction in size of the stochastic component comes at the expense of requiring more parameters to describe the smooth component. The complexity of the piecewise smooth component model includes number of clusters, dimension of a smooth component within each cluster, and the polynomial degree of the component. The family of models may be indexed by a single integer. To find the optimal compression within this family of algorithms this parameter may be varied to minimize the total compression size.

To operate the invention as a lossless compression algorithm, two sets of data are kept. One is piecewise smooth manifold model parameters. The other is the set of residual errors, which represent the difference between a reconstruction of the data using the model and the original data. Ideally, the remaining residual component will only contain the stochastic or noise-like portion of the data. Since the errors are typically very small, the residual components have a much smaller average dynamic range hence may be encoded with relatively few bits. Further, the statistical correlations between individual measurements have been removed using the piecewise smooth manifold model. Hence, the residual component may be treated as independent noise. This makes it possible to entropy-encode the residuals using a conventional compression technique, such as Huffman encoding, which is optimal under these assumptions. The algorithm also provides for a progressive mode in that the fitting and the residual compression may be done on groups of bit planes, progressing from more significant bits to less significant ones.

The algorithm may also be operated in a lossless mode that does not require transmission of the model parameters with the model coefficients (also called coordinates). For example, if the data is statistically stable, it may be that the set of models, and their parameters may be fixed ahead of time. Even if the data does not fit these models well, the compression/decompression algorithms may still function properly in lossless mode. The only issue will be that the compression performance may suffer. However, if the data continues to fit the models well for many granules, there may be no need to change the model parameters and thus the cost of retransmitting these parameters may be saved. Even if the parameters are changed, the parameters may be updated with the change rather than retransmitting the entire specification of the models.

When the compression algorithm is in lossy mode, it may not be necessary to transmit all or part of the residuals. This is especially true if the data fits the model well. In such cases decompressed data without residuals may be sufficiently close to the data for the given application.

In another embodiment of the invention, an error robust mode is provided. A simple hierarchy of criticality is used which may be easily associated with various subpopulations of the data. The data associated with the clustering part of the algorithm of the present invention is particularly sensitive; any single bit flip in the part of the compressed file that contains the model parameters will result in severe error degradation of the reconstructed hyperspectral image. Fortunately, it occupies a very small amount of memory and may be easily protected without affecting the compression ratio. The model parameter data may be protected by very strong error-correction coding. The data that is entropy encoded (i.e., residuals of the approximation) is of the least criticality, but still may require some protection from noise effects. Residual data may be protected by weaker error-correction coding.

Image compression is a well-studied field reflected in part by such well-known compression standards as JPEG and JPEG 2000. The JPEG standard was developed principally for two-dimensional image compression. It relies on Discrete Cosine Transform to implement the compression. JPEG 2000 is an international standard for two-dimensional image compression and relies on wavelet transform to implement compression. Hyperspectral sounder compression is a fairly new topic. The present invention provides a new lossless technique that exploits several chief characteristics of the data that is intrinsic to the domain of hyperspectral grating spectrometer sensor data. These characteristics include: high spectral correlations between consecutive bands; limited number of atmospheric constituents present in each particular hyperspectral image; and spatial correlations of the observed scene. Such features with corresponding processing used in the algorithm are outlined in Table 1.

TABLE 1

| # | Assumption about hyperspectral data: | Corresponding block in the compression algorithm: |
|---|---|---|
| 1 | high spectral correlations between consecutive bands | Affine transform |
| 2 | spatial correlations of the observed scene | 2D compression of projection coefficients |
| 3 | limited number of atmospheric constituents present in each particular hyperspectral image | Adaptive clustering |

It is well established that in order to be effective, the compression methodology may take into account particular structural features of the data to be compressed. Often such structural features, with the potential to facilitate compression, are not at all obvious, and may be brought into play only by algorithms specifically designed to exploit them.

This algorithm may be used by world government space agencies involved in Earth science environment and deep space studies, the Aerospace industry, and the world's users that would be receiving this data from satellite transmissions in Weather forecasting and Earth science research, as well as the world Earth science data archive community all with respect to grating spectrometer sounder data. However, the data compression technique of the present invention may be applied to other data streams as well.

In the present invention, the data stream may comprise a sequence of integers. The data is partitioned into blocks or subportions of the data. An example partition is grouping a hyperspectral image data into blocks representing radiance measurements where each block consists of one spatial field of view and a range of distinct spectral sensitivities (hence a block is a footprint). In another example, a partition may comprise a grouping of hyperspectral image data into blocks representing radiance measurements, where each block consists of n×m spatial window of footprints.

The model parameters may specify the model types model, the number and type of coefficients for a given model type, and a function which assigns to each block a model type. The list of model types and the assignment function are global to the data set and apply to the entire collection of block rather than a particular block. An example set of model parameters would be a lookup table that assigns to each data block an integer k, the specification 'k-linear subspace' having k*dimension+k coefficients, with dimension being the number of integers in the block, and the data type of 32 bit IEEE floating point numbers as a coefficient type.

Model coefficients are a set of values determined by a fit that minimizes the error of a model to the data in the given block where the model type and coefficients type are determined by the global model parameters. An example set of coefficients would be the (k*dimension+k) 32 bit IEEE floating point coefficients representing a least squares fit of the elements in the data block. Residuals are the differences between a single value in the sequence of the individual integers that comprise the data, and the representation of that element according to the model.

DETAILED DESCRIPTION OF THE INVENTION

Figure 1:
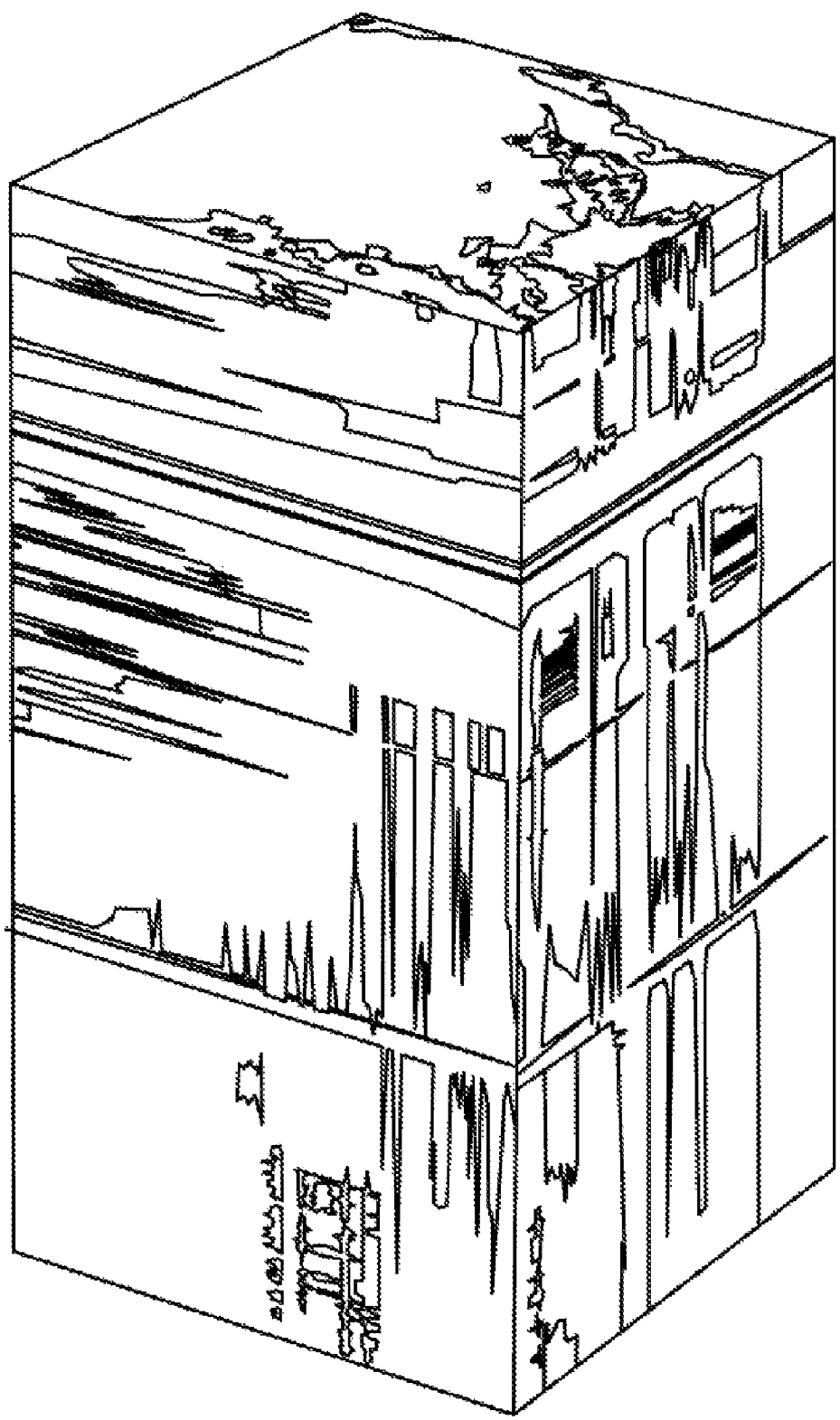
FIG. 1 is a visualization of a portion of a three dimensional AIRS hyperspectral data cube illustrating the strong correlations between neighboring channels.

In the present invention, the approach to hyperspectral data compression exploits properties of hyperspectral imaging that are known a priori to achieve superior results over generic compression methods. There is an extensive literature on generic data and image compression. See, e.g., D. Salomon, *Data Compression: The Complete Reference*, Springer, New York, 2004 (third edition), incorporated herein by reference. All compression is based on implicitly or explicitly exploiting the statistical structure of the data. By accurate modeling and identification of properties special to hyperspectral imaging the present invention is able to obtain a more compact representation of the data. The primary assumptions on the measurements are: 1. there are a small number of physical processes significant for generating the spectral radiances; 2. the measured spectral radiances are highly correlated; 3. The correlations in both the spatial and spectral domain have a piecewise smooth component; and 4. the measurements have a component which is independent and stochastic.

The present invention includes a compression algorithm based on separating the measurements into a piecewise smooth and a stochastic component. The piecewise smooth component models the correlations between nearby measurements. The stochastic part is approximately independent between measurements within the set. Hence, the approach of the present invention is to construct a model which fits a piecewise smooth low parameter description of the data, and subtracts it from the sample. If the fitting captures all the important dependencies, the residual values are independent. Empirically, the residual values are Gaussian, and may be compressed optimally using entropy encoding.

In addition to achieving high compression results, this natural decomposition has other advantages, such as error tolerance when transmitting over a noisy channel. The errors inevitably introduced during such a transmission, may propagate throughout the entire granule when using a generic compression algorithm. The decomposition used for the algorithm, makes it possible to minimize this error propagation.

The compression algorithm is tested empirically using AIRS data. The AQUA-EOS AIRS is the first of the new generation of high spectral resolution infrared sounders. AIRS is an IR grating spectrometer that measures upwelling radiance between 3.74 μm and 15.4 μm in 2378 channels (See, e.g., H. H. Aumann, M. T. Chahine, C. Gautier, M. D. Goldberg, E. Kalnay, L. M. McMillin, H. Revercomb, P. W. Rosenkranz, W. L. Smith, D. H. Staelin, L. L. Strow, and J. Susskind, "AIRS/AMSU/HSB on the Aqua Mission: design, science objectives, data products, and processing systems," *IEEE Trans. Geosci. Remote Sensing* 41(2), pp. 253-264, 2003, incorporated herein by reference).

The AIRS instrument also includes an IR spectrometer and four visible/near-IR (Vis/NIR) channels. Signals from both the IR spectrometer and the Vis/NIR photometer are passed through onboard signal and data processing electronics, which perform onboard signal and data processing electronics, which perform functions of radiation circumvention, ground-programmable gain adjustment and offset subtraction, signal integration, and output formatting and buffering to the high-rate science data bus.

AIRS takes 90 measurements as it scans 48.95 degrees perpendicular to the satellite's orbit every 2.667 seconds. In the present invention, data granules are made up of Level 1A digital counts representing 6 minutes (or 135 scans) of measurements. These data are processed operationally at the National Oceanographic and Atmospheric Administration, National Environmental Satellite, Data and Information Service (NOAA/NESDIS). See, e.g., M. Goldberg, Y. Qu, L. M. McMillin, W. Wolf, L. Zhou, and M. Divakarla, "AIRS near-real-time products and algorithms in support of operational numerical weather prediction," *IEEE Transactions on Geoscience and RemoteSensing* 41, pp. 379-389, 2003, incorporated herein by reference. The near real-time AIRS data offer a unique opportunity to use empirical satellite observations as a test-bed for data compression studies of future hyperspectral sounding instruments.

The goal in hyperspectral imaging is to determine across space, time, and wavelengths, the distribution of radiances. These radiances partially reveal both properties and state of the scene by determining the reflectance and scattering of light from the sun, and the emission of light through thermal radiation (heat).

Variations in reflectance, scattering, and thermal radiation arise from diverse phenomena such as the presence of clouds, the temperature profile across altitudes, as well as variations in water vapor and other gases (such as $CO_2$, ozone, methane, etc), aerosols, and surface properties.

The observed variations in radiances come from two qualitatively different sources. One source of variation comes from the fact that the distribution of radiance sources and scatterers satisfies differential or integral equations. For example, in the thermal IR domain, radiances are determined by the distribution of temperatures in the atmosphere as mediated by radiative transfer equations. Solutions to such equations tend to be locally smooth almost everywhere with abrupt discontinuities along singularities. The other source of variations in radiances in the scene is stochastic in nature. For example, distributions of individual clouds and the arrival of photons at the instrument are well modeled as random processes.

In addition to the two sources of variations in the radiances, there are similarly two sources of variation that come from the measurement processes of the radiance. One source of variation tends to be locally smooth with possible changes at singularities, combined with random fluctuations. Locally smooth variations also come from biases in the instruments. These include spatial attenuation of the data due to varying polarization with changes in the scan geometry, and varying sensitivity of the basic sensor across the spectrum. The random fluctuation in measurement comes from electronic noise as well as from the thermal dynamics of the sensor.

Fortunately, the aggregation of these effects combines so that the variation in the raw measurements may be well modeled as a sum of a piecewise-smooth component and a zero-mean stochastic component. This is the basis of the compression method of the present invention. The raw measurements are collected into arrays of data called feature vectors, which are treated independently. The measurements that make up these feature vectors are related both spatially and spectrally and chosen so as to capture all significant dependencies in the data. The piecewise locally smooth structure allows us to smoothly index these arrays compactly with a small number of parameters called local coordinates. It also allows determination of a map from the local coordinates back to the data space in a way that approximates the full vector of measurements well. In this way, one may store the parameters of a map, and the low parameter local coordinates for each data point. This results in a large reduction in the amount of data that needs to be stored to approximate the original data. The approximation may be used to achieve lossless compression by adding a subsequent step that preserves all information. To preserve all the information, the residual errors between the approximation and the data are stored. It should be noted that in this connection that the measured data are stored in the integer form. Ideally the remaining residual component will only contain the stochastic or noise-like portion of the data.

Since the errors are typically very small, the residual components have a much smaller average dynamic range, hence may be encoded with relatively few bits. In the present invention, the statistical correlations between individual measurements are contained in a piecewise smooth manifold component. The residual component may be treated as independent noise and entropy encoded using a conventional compression technique, such as Huffman encoding, which is optimal under these assumptions. See, e.g., D. Huffman, "A method for the construction of minimum redundancy codes," *Proc of IRE* 40, pp. 1098-1101, 1952, incorporated herein by reference. While the model of the present invention may be made arbitrarily flexible for the part of the data that is piecewise smooth, there are hard theoretical limits to the lossless compression of stochastic sampled data. Thus the separation focuses effort on that portion of the data that may be compressed while maintaining optimal compression on the more difficult portion.

For the purposes of compression, it is most effective to work directly on the raw digital counts produced by the AIRS instrument. Information theory imposes certain limitations on the ability to compress data without losing information. See, e.g., C. E. Shannon, "Communications in the presence of noise," *Proc. of IRE* 37, pp. 10-21, 1949, and C. E. Shannon, "A Mathematical Theory of Communication," *The Bell System Technical Journal* 27, pp. 379-423,623-656, 1948, both of which are incorporated herein by reference. In the present invention, digital counts are used, rather than a post-processed a rounded version of the radiance data, since in line with the previous observation, this processing introduces additional randomness.

In the context of the present invention, the AIRS granules are organized into 2378 infra-red (IR) spectral channels, for each footprint. In one embodiment, 1501 stable channels are used, selected by NOAA scientists. The granule is therefore made up K=1501 channels spectrally, I=90 footprints per scan line and J=135 scan-lines. FIG. 1 illustrates of a portion of a three dimensional AIRS hyperspectral data cube, illustrating a visualization of Channels 1207-1501 of an AIRS granule. Note the strong correlations between neighboring channels.

These I×J×K hyperspectral data cubes may be represented as a bounded integer-valued function q(x, y, v) defined on the integer lattice points $1 \leq x \leq I$, $1 \leq y \leq J$, $1 \leq v \leq K$. Here x, y indices may be interpreted as coordinates on the geospatial grid and the v-corresponds to the sensor's spectral channel. The values q, or digital counts, are a quantization of an analogue signal which is approximately linear in irradiance at the sensor, integrated over a narrow portion of the spectral domain. The precise relationship with scene radiance is known from calibration methods described in H. H. Aumann, D. T. Gregorich, S. L. Gaiser, D. F. Hagan, T. S. Pagano, L. Strow, and D. Ting, "AIRS level 1b algorithm theoretical basis document (ATBD) part 1 (IR)," 10 Nov. 2000, incorporated herein by reference. However it is not crucial here since the compression method of the present invention operates directly on digital counts. The quantization into digital counts, has a range of $[0, 2^{N_{bits}}-1]$, where $N_{bits}$ is the number of bits per measurement. For AIRS three ranges of channels were given different bit depths due to the varying noise characteristics. For the first 514 channels the bit depth was $N_{bits}=12$, for spectral channels 515-1205, $N_{bits}=13$ and for 1206-1501, $N_{bits}=14$.

One may interpret a granule as a sequence of 1501 single channel geospatial images q(x, y, v) of size 90×135, each obtained by fixing the spectral parameter v. Alternately, consider the granule as a collection of vectors $q_{x,y}$=q(x, y, v) representing a quantized sampling of the spectral curve for each footprint. The algorithm of the present invention is based on the fact that the digital counts have a strong degree of coherence across spectral channels for a single footprint. This is motivated by the fact that the digital counts across channels depend on the temperatures and the water vapor content of the atmosphere at different altitudes. These quantities vary smoothly with some discontinuities. Hence, the compression approach of the present invention is based on extracting the spectral redundancy by approximating the spectral curve in each footprint from a family of curves with a small number of parameters.

Computationally, it is more convenient to work with the set of vectors $q_{x,y}$ for all the footprints. One goal will be to represent these values in an efficient manner. The set of footprints are contained in a K-dimensional Euclidian space $\mathbb{R}^K$. For example, K=1501 for AIRS granules. In the present invention, it has been found effective to decompose the spectral channels into disjoint dimension ranges and treat them independently, each with its own value for K. Denote all vectors $q_{x,y} \in \mathbb{R}^K|$, for all footprints in the granule by Q.

Lossy compression seeks to approximate elements of Q compactly while minimizing the approximation error. In lossless compression, Q should be reconstructed without error. Nevertheless, a method which is able to approximate Q with a small approximation error may also be used for lossless compression. Rather than store the original measurements, one stores the parameters for the approximation, and the approximation error values or residuals at each point. One error value may be stored for each measurement. Although the number of entries that may be stored is the same as the original number of measurements, it should be noted that if the approximation is good, the average range of values is quite small. This means the number of bits per measurement required may be greatly reduced using entropy encoding. Conversely a good approximation should be compact, requiring only a few parameters, and thus represents a significant reduction in size from the original data. Hence, a combination of the low parameter approximation and the low bit rate residual makes it possible to achieve high compression losslessly.

In hyperspectral image data the footprints occupy a high dimensional space $\mathbb{R}^K$. The effective degrees of freedom of scene radiance, and thus digital counts, should be significantly smaller than K. Empirically, the points in Q tend to aggregate near considerably lower-dimensional hyperplane of $\mathbb{R}^K$. Note that the local number of degrees of freedom of this space will typically be considerably smaller than the apparent dimension due to strong spectral correlations. One strategy to find this plane is principal component analysis, also known as the Kohonen-Louve (KL) transform.

Figure 2:
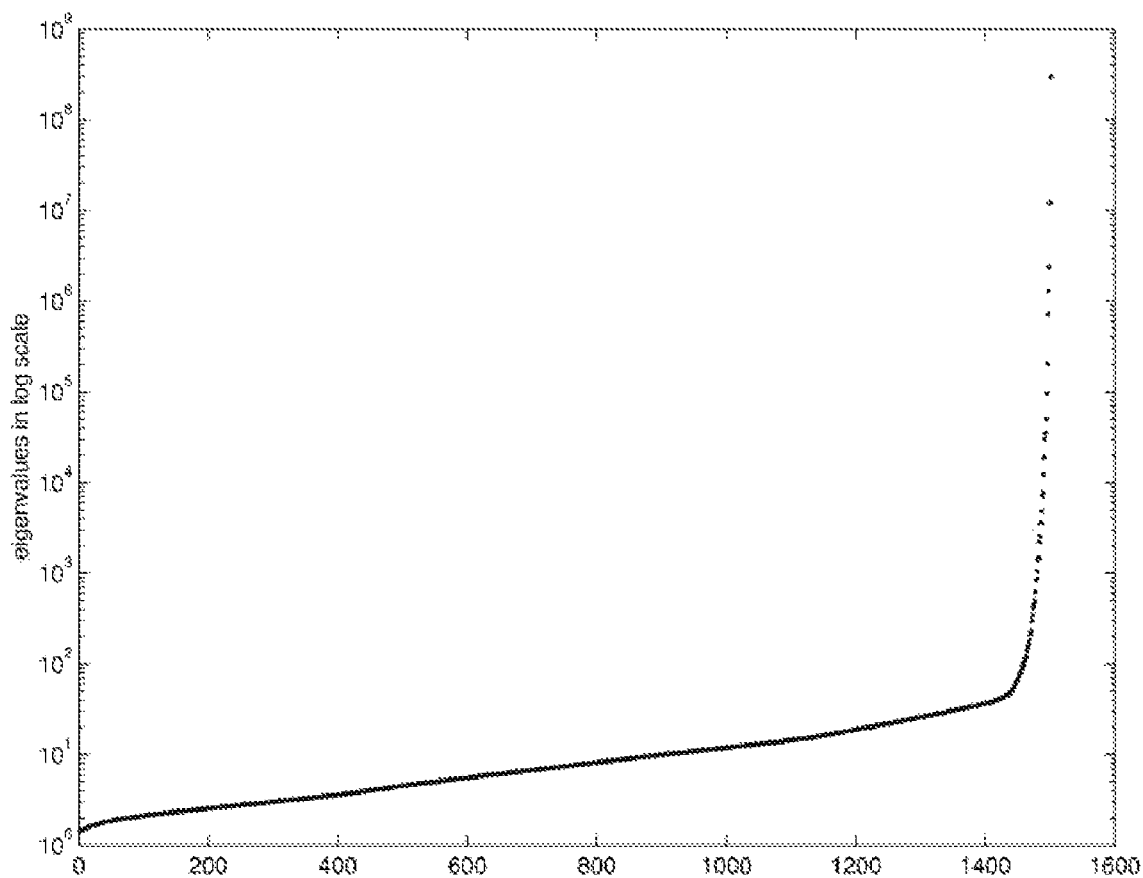
FIG. 2 is a graph illustrating the rapidly decaying eigenvalues for the covariance of footprints in a granule.

Underlying the PCA algorithm is an assumption that the data has an approximately Gaussian distribution. For such a distribution, coordinates may be established which efficiently represent the data. A Gaussian is parameterized by a vector representing its center $\mu$, and a symmetric matrix $\Sigma$, which represents directions and relative variances of an orthogonal coordinate system aligned to the data. The vector $\mu$ is estimated by computing the mean of the data and $\Sigma$ is obtained by computing the covariances. The eigenvectors of $\Sigma$ form an orthonormal basis of $\mathbb{R}^K|$. The variance of the data along the direction of each of the eigenvectors is the corresponding eigenvalue. Hence the size of the eigenvalue determines how significant that dimension is in describing the variation of the data set. FIG. 2 is a plot illustrating the rapidly decaying eigenvalues for the covariance of footprints in a granule.

Figure 3:
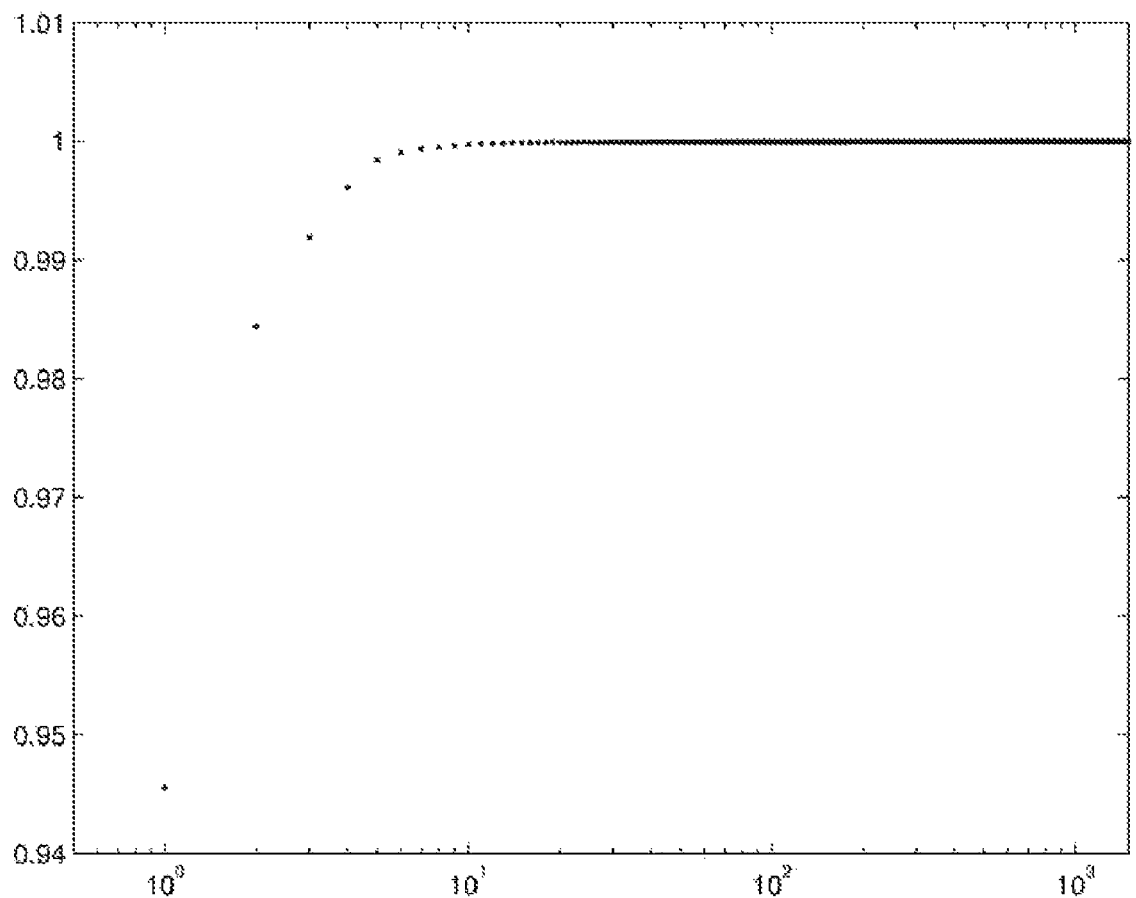
FIG. 3 is a graph illustrating total cumulative energy explained by finite dimensional hyperplanes of footprint space, showing more than 99% of the energy is explained with only 3 components.
Figure 4:
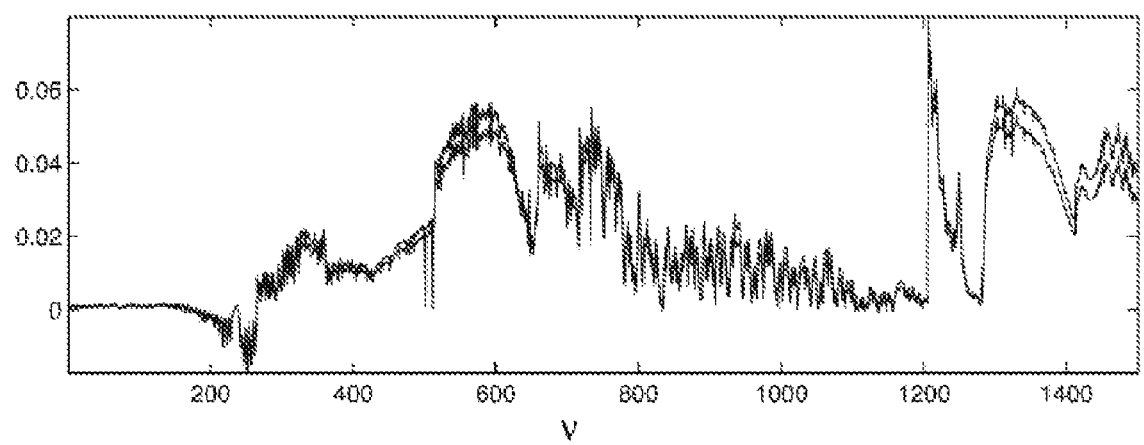
FIG. 4 is a plot of the envelope of multiple estimates of the first principal component, where the narrow width of the envelope indicates that a well defined direction of greatest variation in the data set.

The rapid decay of the eigenvalues shows that it is possible to explain most of the variation in the footprint space with a few parameters. FIG. 3 is a plot of the total cumulative energy explained by finite dimensional hyperplanes of footprint space. More than 99% of the energy is explained with only three components. Note, the graph is shown in log-scale for visual clarity. In FIG. 3, only three components are needed to approximate the data so that 99% of the variation is represented, as measured by a least squares error metric. FIG. 4 illustrates the envelope of multiple estimates of the first principal component. The narrow width of the envelope indicates that a well-defined direction of greatest variation in the data set. FIG. 4 shows multiple estimates of the eigenvector associated to the largest eigenvalue. This eigenvector is called the first principle component. Each of the estimates was obtained by independently choosing a collection of random samples. Note that the estimates are very consistent.

The line passing through the mean in the direction of the first principle component is the best least squares fit of a line to the data. Similarly the plane passing through the mean, spanned by the first two eigenvectors, is the best plane approximation in the least squares sense. If the data lives close to an N-dimensional hyperplane of $\mathbb{R}^K$, the smallest K−N eigenvalues will be very small. Hence, the data may be accurately approximated by projection onto the hyperplane $V_N$, passing through the mean and spanned by an first N eigenvectors vectors $$a_1, a_2, \ldots, a_N \quad (1)$$

These are known as the principal (N) components. The coordinates of a point $q \in Q|$ projected into the principal N-dimensional hyperplane is given by $$\rho n = (an, q-\mu), 1 \leq n \leq N. \quad (2)$$

The error vector $$q\epsilon = q - \mu - \rho_1 a_1 - \ldots - \rho_N a_N, \quad (3)$$

is a vector perpendicular to the hyperplane $V_N$.

The coefficients $\{\rho_n\}^N_{n=1}$, are indexed by (x, y). These may thus be interpreted as N 2D images. These coefficients, the vectors $a_n$, and differences $\tilde{q}$ together make it possible to reconstruct the original file. The objective function to be minimized is the size of the compressed file. PCA is, however minimizing the least squares Euclidian error to a hyperplane. This is a convenient proxy, which in some cases is equivalent. See, e.g., G. Davis and A. Nosratinia, "Wavelet-based image coding: An overview," *Applied and Computational Control, Signals, and Circuits* 1(1), 1998, incorporated herein by reference.

The PCA approximation has the effect of removing correlated variations in measurements across channels. The coordinates of the residual vector $\tilde{q}_\varepsilon$ are variations, which may be approximated by independent and identically distributed (iid) noise. This noise is the component of the data model that may be referred to stochastic. In the present invention, the model of the data as a combination of a piecewise linear component and a stochastic component is of course a familiar signal plus noise model. Let $\{\rho^n\}^N_{i=1}$=X be a vector-valued random variable. Modeling a spectral set of measurements of a footprint as a vector-valued random variable Y satisfies the relation:

$Y=f(X)+\eta$, where the model f(X) is assumed to be linear, and $\eta$ is a vector-valued random variable representing iid noise.

Huffman coding is one example of a coding scheme that is optimal for these assumptions. The compression achieved is a combination of the compressed residuals, the compressed PCA coefficients, and the PCA eigenvectors.

Figure 5:
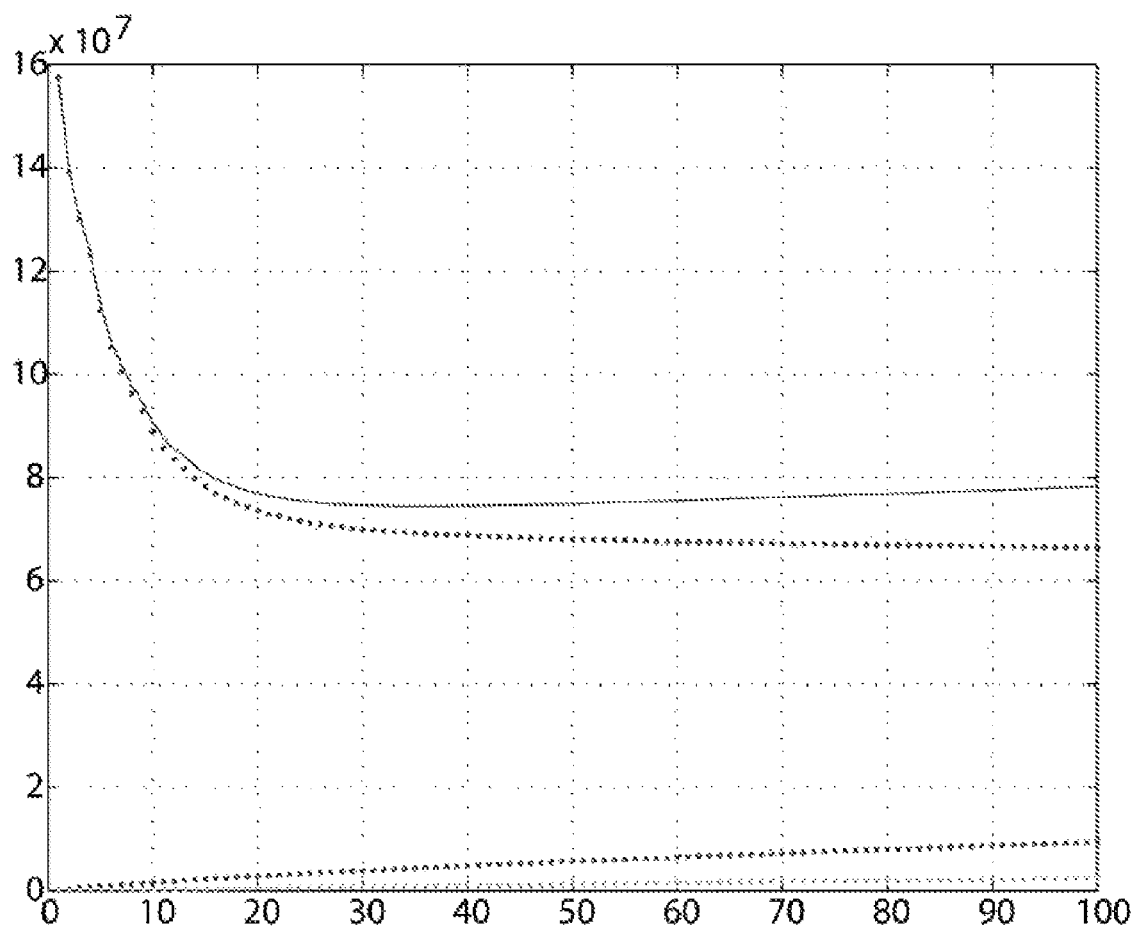
FIG. 5 is a graph illustrating the memory requirements for storing the footprints as a PCA based representation as a function of the dimension of the approximating hyperplane.
Figure 6:
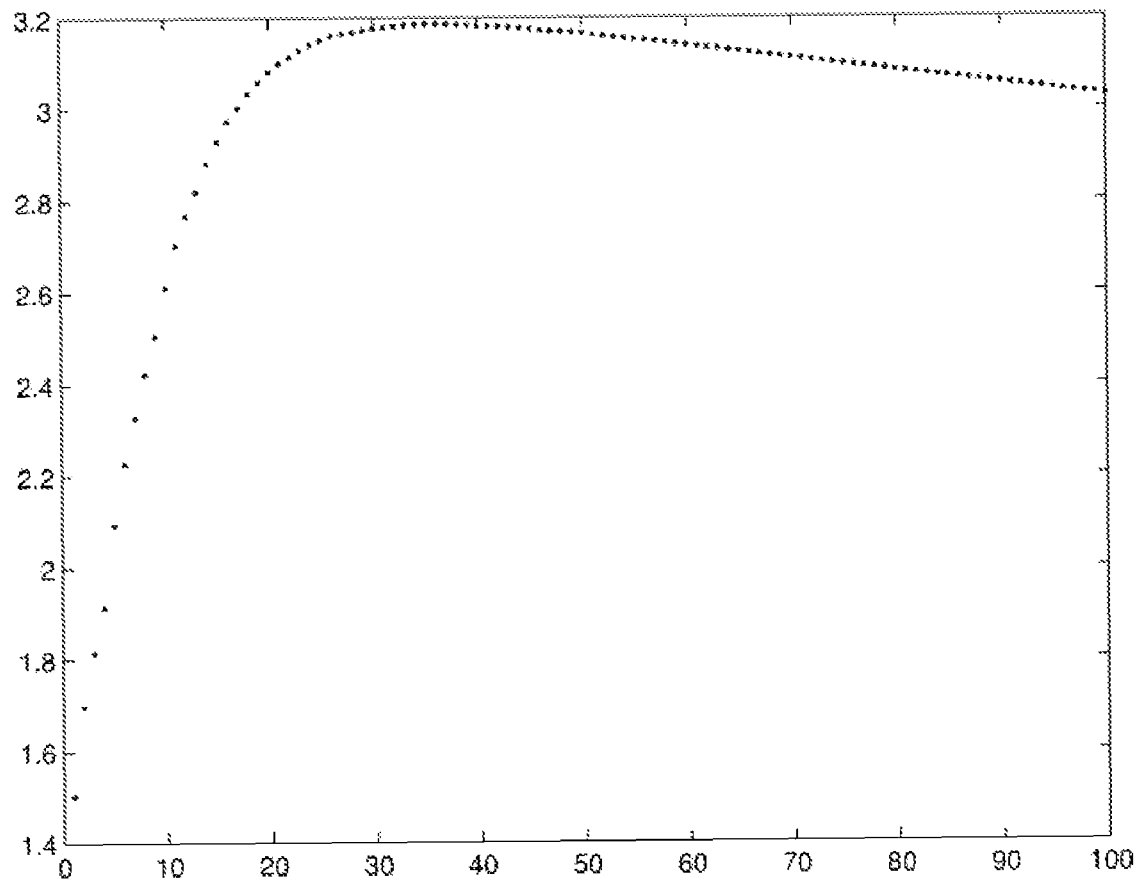
FIG. 6 illustrates the compression ratio as a function of number of PCA components.

FIG. 5 is a graph illustrating memory requirements of storing the footprints as a PCA based representation as a function of the dimension of the approximating hyperplane. FIG. 6 is a graph of compression ratio as a function of number of PCA components. FIG. 5 shows the memory sizes of these three data components as a function of the number of principal components. The memory size needed to store the residual errors (the blue dotted curve) monotonically decrease as more principal components are used. Initially the reduction in the size of the residuals is large compared with the extra space required to store more principle component coefficients (the red dotted line), as well as the principal components themselves (the green dotted line). At some point increasing the number of components simply exchanges memory required to store residuals for memory needed to store the principle component coefficients. However, as may be seen in FIG. 6, in the interval between 30 and 40 dimensions the ratio curve flattens and then starts to decrease, due to additional overhead needed to store principle components.

While a PCA based linear model is capable of capturing correlations between different dimensions, it assumes that the data is clustered about a single hyperplane. To understand this better, consider an equal mixture of two sharply peaked Gaussians in one dimension with widely separated means. If this mixture is treated as a single gaussian, PCA would estimate a large variance, and a μ between the true means. Hence the residuals from Eq. (3) will be quite large, almost certainly limiting compression. Constructing a classifier that assigns data to the nearest cluster and store the cluster mean, the residuals could be dramatically reduced.

Figure 7:
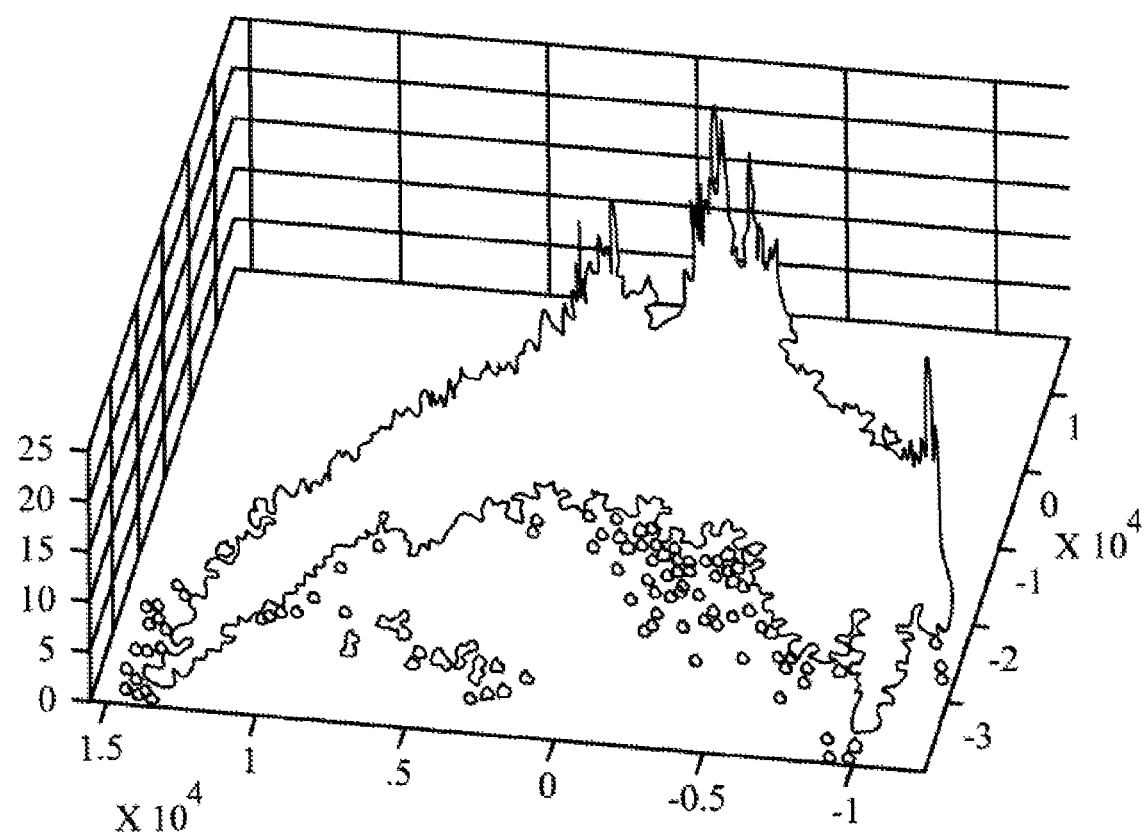
FIG. 7 is a 2D Histogram of AIRS footprints projected onto the first two principle components. It is clear that that the footprints are not distributed as a single gaussian.

FIG. 7 is a 2D Histogram of AIRS footprints projected onto the first two principle components. It is clear that that the footprints are not distributed as a single gaussian. One question that arises is whether the AIRS data best be represented by a single or by multiple clusters? As a visual answer to this question one may project footprints onto the first two principal components since they explain most of the variance as seen in FIGS. 2-4. In FIG. 7, a 2D histogram shows the density of data points projected into these two principle components. At least three large clusters are apparent. This suggests that a successful compression algorithm should combine PCA and clustering. In particular, the approach is to cluster the data set and perform PCA on a per-cluster basis. If the number of clusters is relatively small, this may increase the flexibility of the model at a modest cost when compared to using more principle components. For each cluster, a set of eigenvectors and a mean are stored. In terms of FIG. 5 this increases the relatively small amount of memory used by the eigenvectors (the green dotted line). It is important to note that using multiple clusters does not increase the number of coefficients (the red dotted line) required and yet further reduces the memory required to store the residuals.

If one has M clusters, one may associate a matrix $A_m$ to each cluster whose columns $a_{m,k}$ are eigenvectors of the covariance of that cluster. The error of this representation may be written as an objective function:

$$L(A_1, A_2, \ldots, A_M) = \sum_{q \in Q} \min_{1 \leq m \leq M} d^2(A_m, q). \quad (5)$$

where $d(A_m, q)$ is the distance from a point q to the hyperplane spanned by the columns of the matrix $A_m$. This is denoted as a hyperplane of dimension N by $V_m$.

The distance from a q to the closest hyperplane is defined by the minimum of $d(A_m, q)$ with respect to the index m and the objective function in (5) is the sum of the squares of distances from every point q in Q to the closest hyperplane defined by $A_m$'s. If a point is found to be relatively close to more than one cluster, then it is assigned so that when projected onto the cluster's principle hyperplane, it is closest to the cluster mean (resolving ties). So let c(q) be a map that describes the above-determined assignments for each point q.

The optimization of the objective function L in (5) is done iteratively. At each step of the iteration, compute N first principal directions, $a_n$, for each of the M current iteration's clusters, and the resulting distances $d(A_m, q)$ from each point $q \in Q$| hyperplane $\mathbb{R}^N(A_m)$ defined by $a_n$, n=1, . . . , N. The smallest of the distances will determine the cluster to which that point belongs and the ties are resolved as mentioned above. After effecting the resulting reassignments, the next iteration of the algorithm begins. Note that this algorithm may be viewed as a version of the K-means cluster algorithm for hyperplane. See. e.g., R. O. Duda, P. E. Hart, and D. G. Stork, Pattern Classification, S. E, Wiley Interscience, 2000, incorporated herein by reference.

As with most iterative algorithms, the initial conditions are very important. In order to find the global optimum, the initialization should begin reasonably close. There are a number of general methods that have been proposed to initialize K-means type problems and avoid local minima. For this data, it was found that a rather simple approach is satisfactory. The initialization procedure begins by fitting a line/to the entire data set Q. Consider the projection of the dataset onto the line l. This line is broken up into segments, so that an approximately equal density of points projects onto each line segment. Since the principle direction is the direction that best explains the variance of the data, this segmentation results in an initial partitioning of the data into approximately equal parts. The following set of Figures show an example of the clustering described above. Four clusters are chosen for visual clarity. The actual number of clusters depends on the granule and is determined adaptively.

Figure 8:
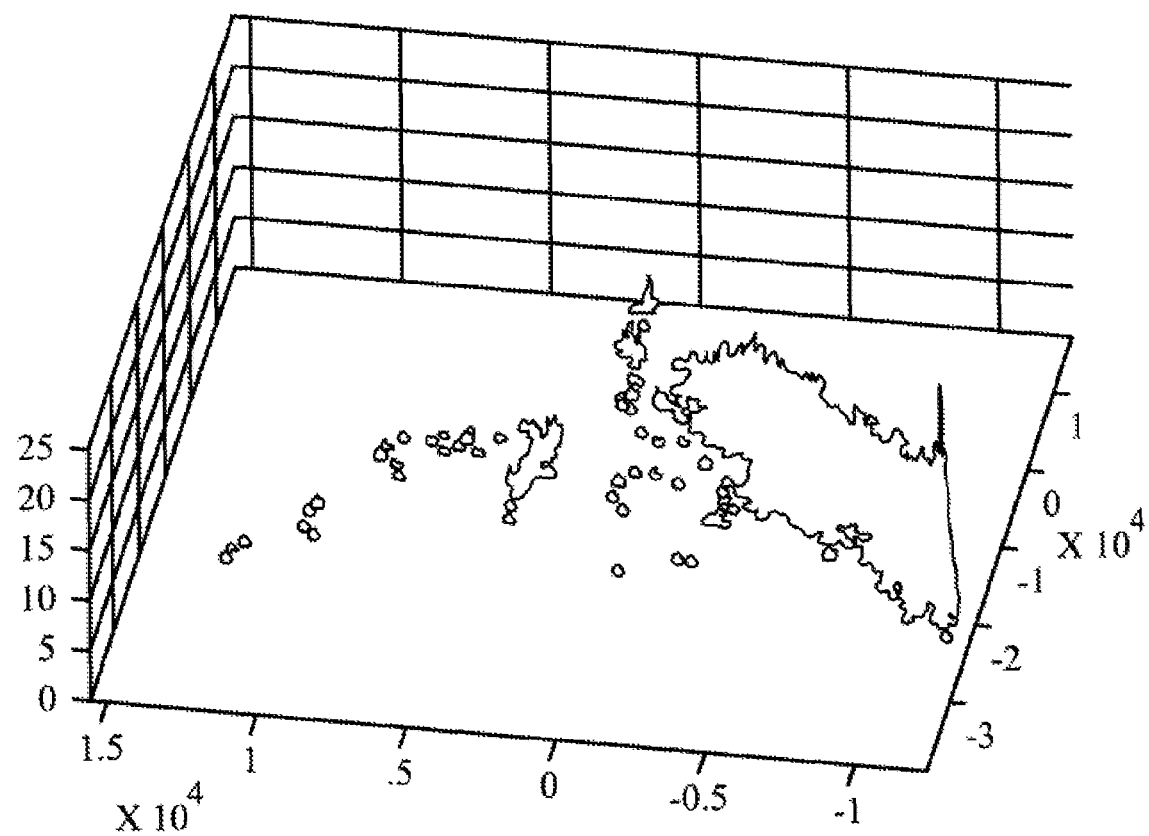
FIG. 8 is a 2D Histogram of the first cluster projected onto the first two principle components of the cluster.
Figure 9:
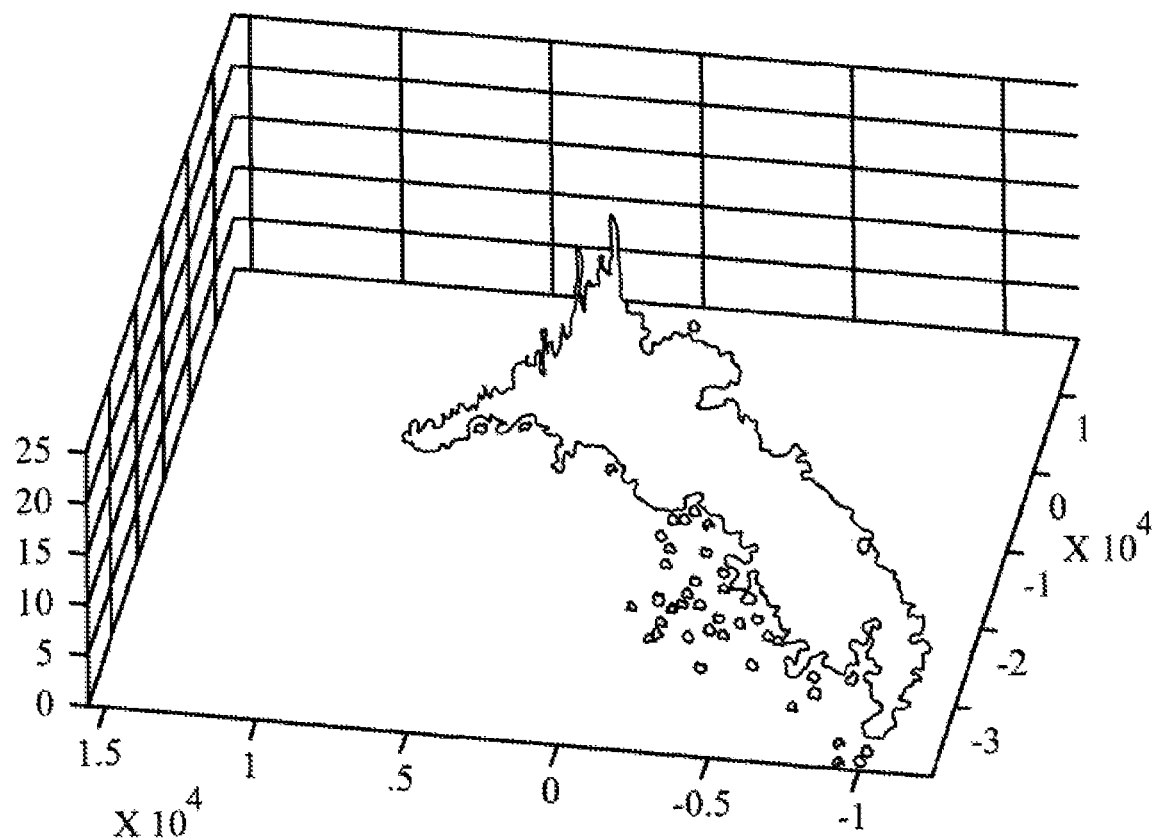
FIG. 9 is a 2D Histogram of the second cluster projected onto the first two principle components of the cluster.
Figure 10:
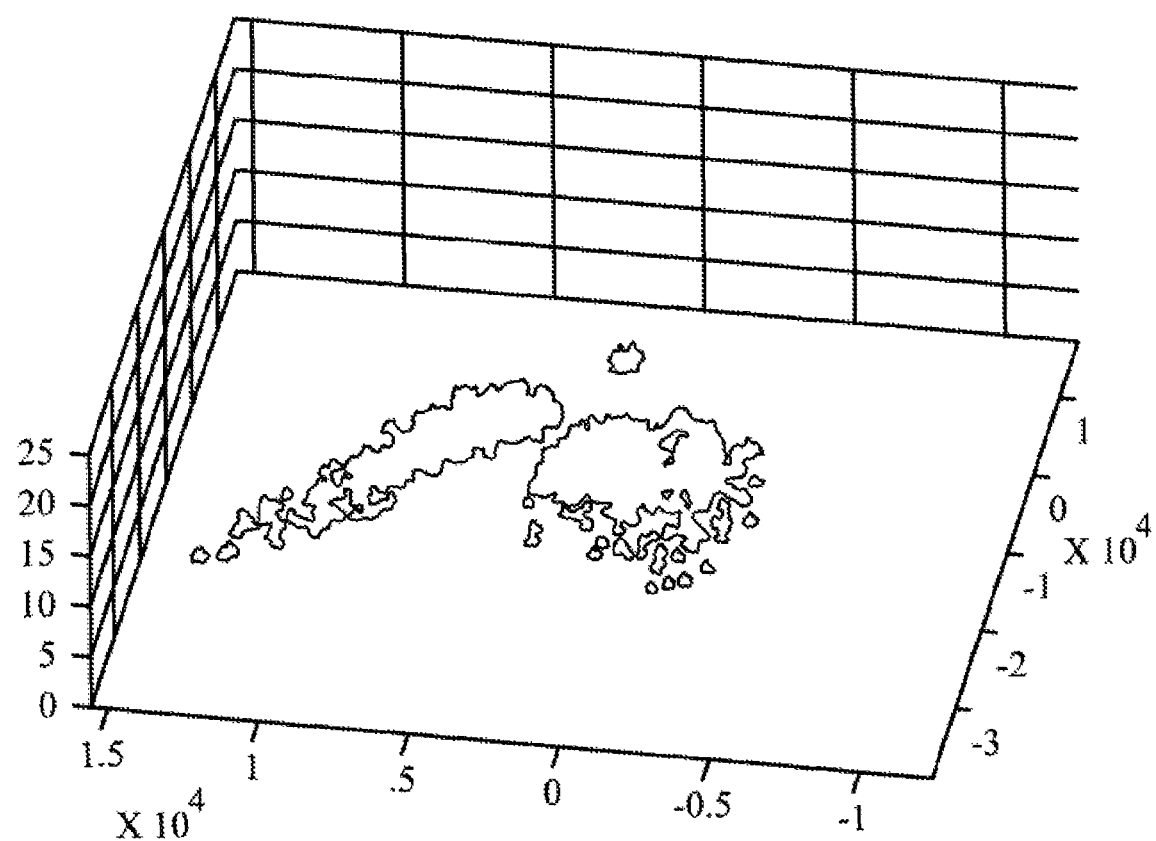
FIG. 10 is a 2D Histogram of the third cluster projected onto the first two principle components of the cluster.
Figure 11:
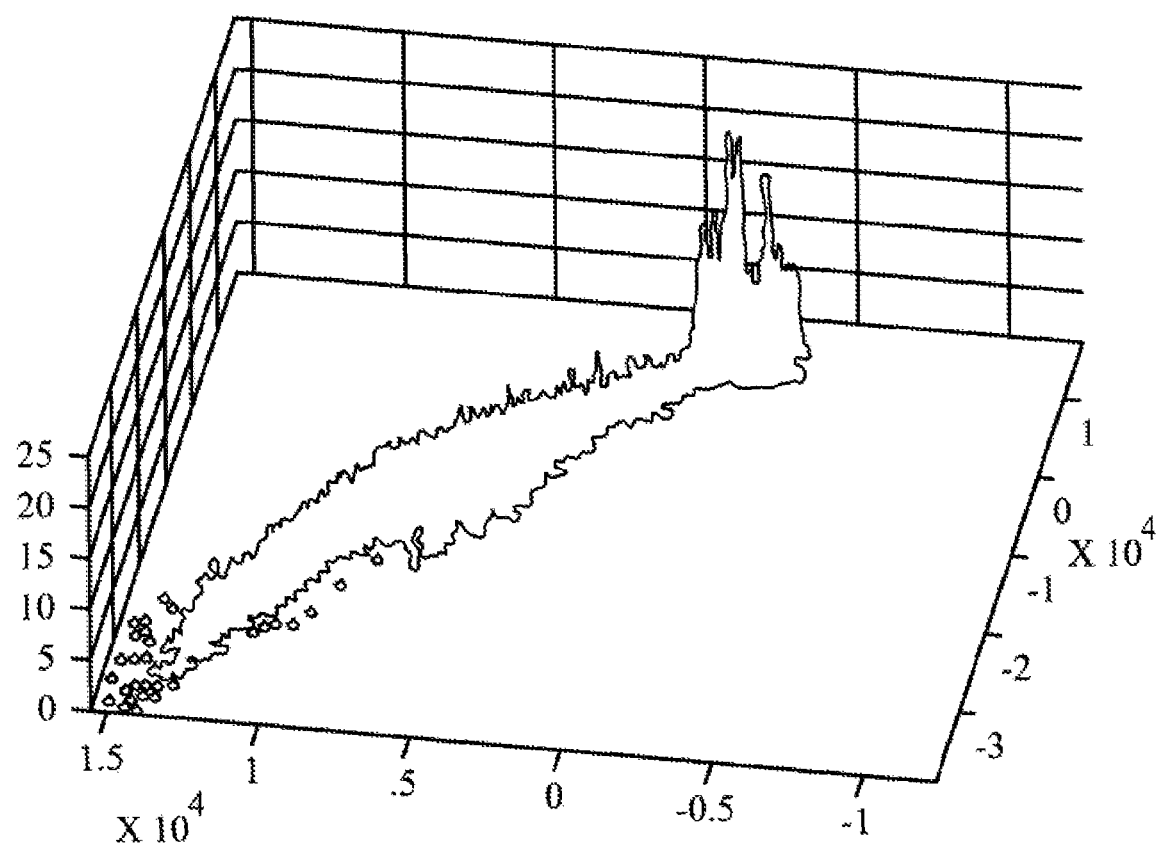
FIG. 11 is a 2D Histogram of the fourth cluster projected onto the first two principle components of the cluster.
Figure 12:
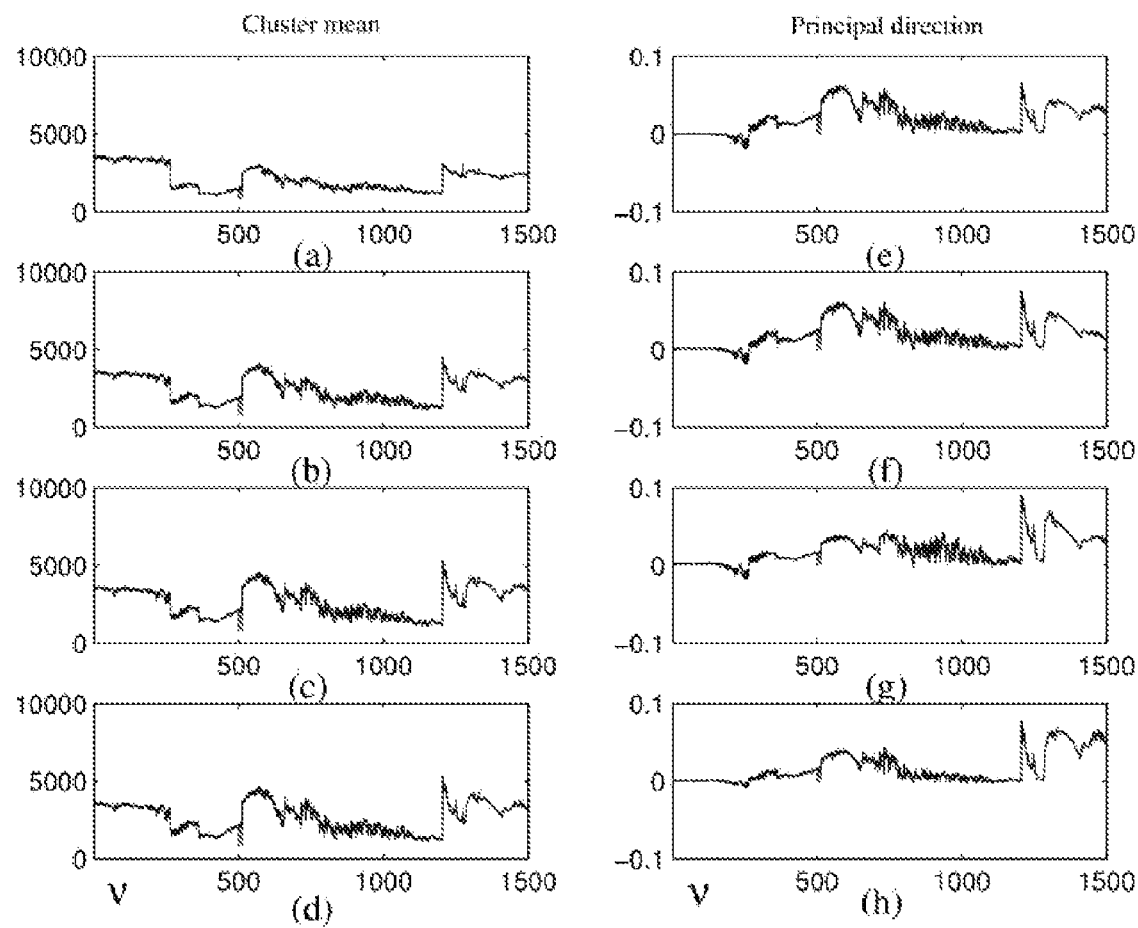
FIG. 12 is a series of plots illustrating the means and principal directions for each of the four clusters.

FIG. 8 is a 2D Histogram of the first cluster projected onto the first two principle components of the cluster. FIG. 9 is a 2D Histogram of the second cluster projected onto the first two principle components of the cluster. FIG. 10 is a 2D Histogram of the third cluster projected onto the first two principle components of the cluster. FIG. 11 is a 2D Histogram of the fourth cluster projected onto the first two principle components of the cluster. FIGS. 8-11 display a 2D histogram for each cluster. Each histogram characterizes the density of data points associated with an individual cluster, projected into its own principle components. FIG. 12 contains plots for the means and principal directions of each cluster. Note that means of the clusters 2 and 4 (plotted in FIG. 12(a) and FIG. 12(c)) appear to be very similar, but their principal directions (plotted in FIG. 12(e) and FIG. 12(g)) are not. The same phenomena may be observed in FIGS. 9 and 11, where the locations of the peaks of the corresponding histograms are very close, but the orientation of the principal directions for clusters 2 and 4 are quite different. It may also be observed that the orientation of clusters 1 and 2 (cf. FIGS. 8 and 9) are very similar, but the location of the peaks of these clusters are far apart. In this case, the principle directions are similar (cf. plots 12(e) and 12(f)), but the clusters have different means (cf. plots 12(a) and 12(b)).

Figure 13:
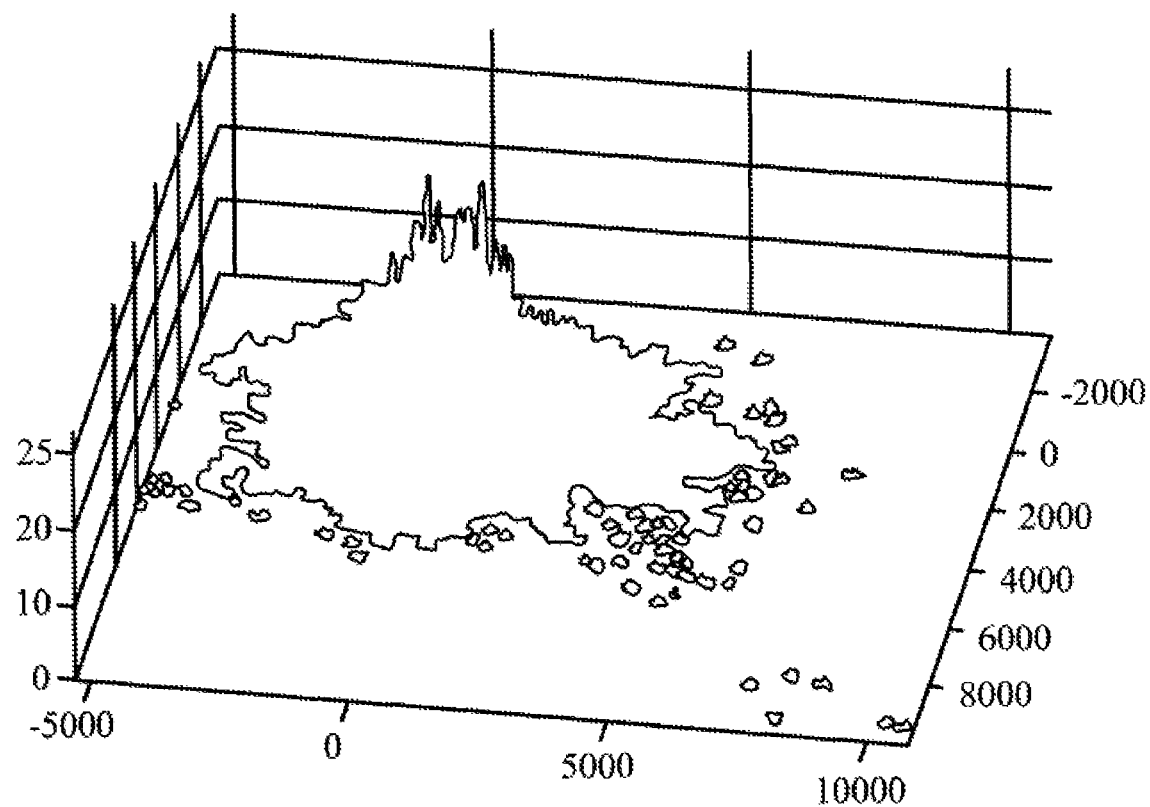
FIG. 13 is a 2D Histogram set of residuals left after subtracting from each footprint the projection onto corresponding first principal direction for corresponding to each cluster.
Figure 14:
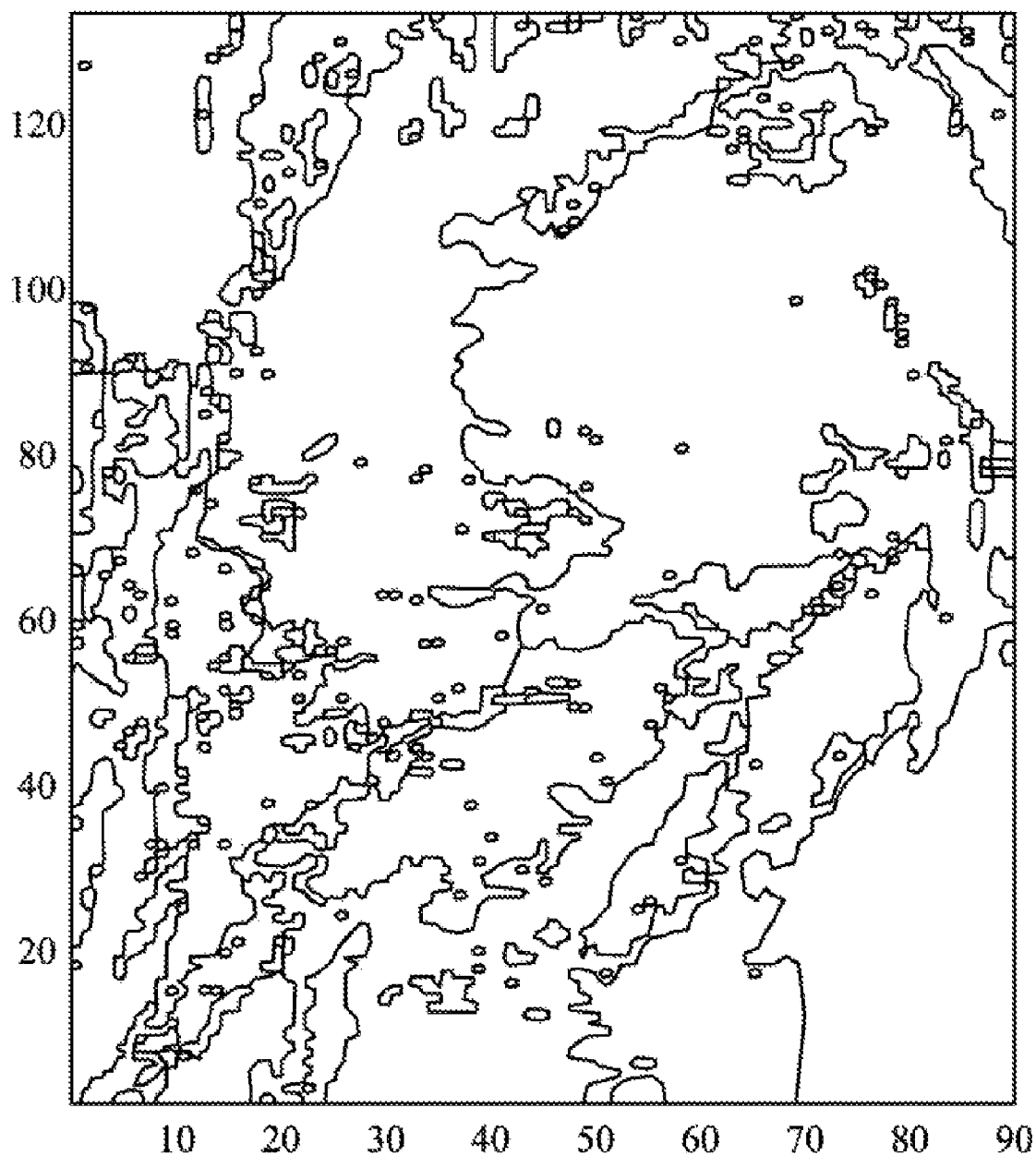
FIG. 14 is an assignment map where each footprint location has been colored according to its assignment by c(q) to one of the four clusters.

FIG. 14 is the assignment map. In FIG. 14 each footprint location has been colored according to its assignment by c(q) to one of the four clusters. Note that although the algorithm of the present invention operates in the footprint space without making use of spatial proximity, the assignment map indicates there are strong spatial dependencies between footprints in the granule. After having subtracting from each footprint the projection onto corresponding first principal direction for corresponding to each cluster, one is left with a set of residuals. These residuals appear very close to Gaussian as is apparent from FIG. 13. It is also clear that the residuals are not isotropic. This makes it possible to reduce the size of the residuals still further by projecting and encoding the principal components of the residuals. The remaining residuals are encoded using Huffman encoding.

Figure 15:
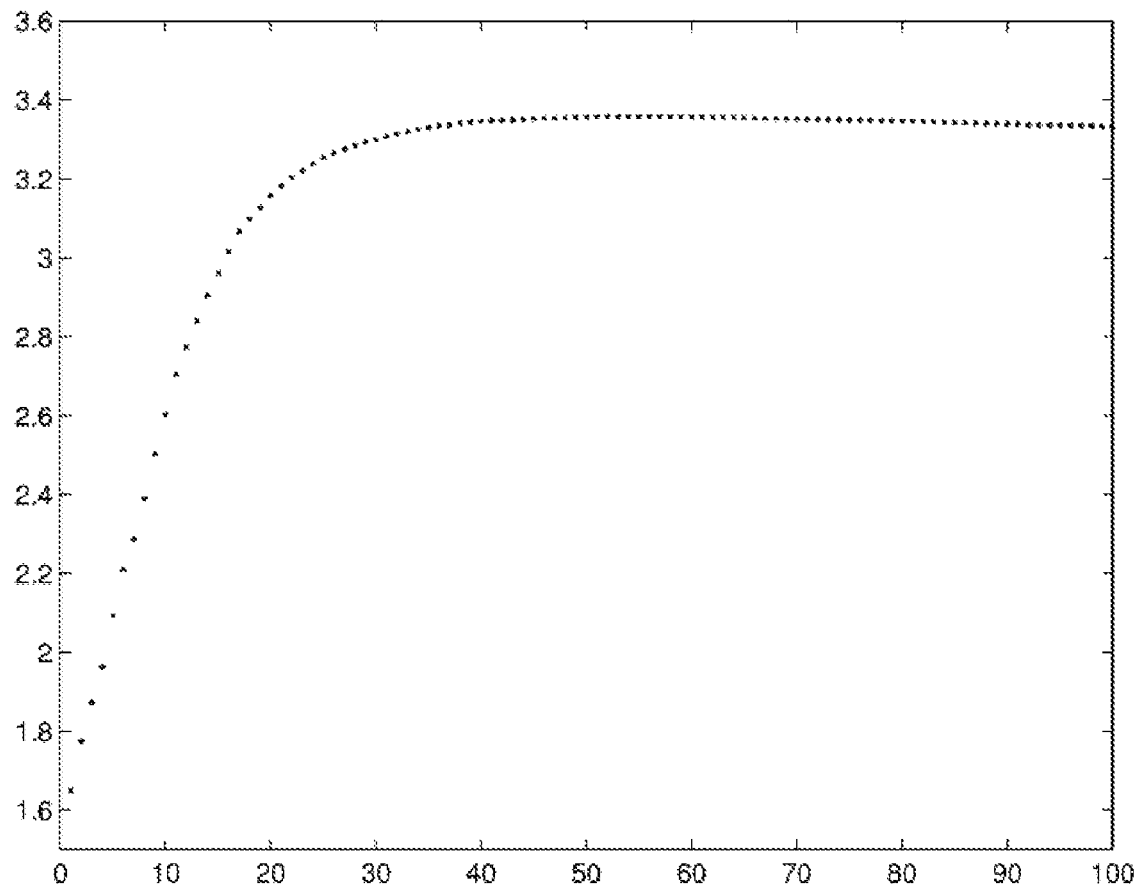
FIG. 15 is a plot of compression ratio as a function of principal components for the considered example with just 4 clusters.

Compression ratio as a function of number of principal components for the demonstration case with just four clusters is shown in FIG. 15. FIG. 15 illustrates the compression ratio as a function of principal components for the considered Example with just 4 clusters. Note that the usage of four clusters has improved the compression ratio from 3.2 to 1 to 3.4 to 1. The results for adaptive clustering are given in the following section.

A data sample comprising an entire day's worth of global AQUA-EOS AIRS Level 1A counts data (235 granules) was used to evaluate the compression algorithm. As described at the end of Section 4 the mean bit-depth is 12.85 bits/sample. The algorithm was able to achieve a lossless bit-rate of 3.47 bits/sample or a mean compression ratio of 3.7 to 1. Compression ratios achievable by the method of the present invention for these hyperspectral data sets compare very favorably with what is currently achievable by other approaches as of the August 2005 special session of the SPIE Conference on Satellite Data Compression, Communications, and Archiving.

Figure 16:
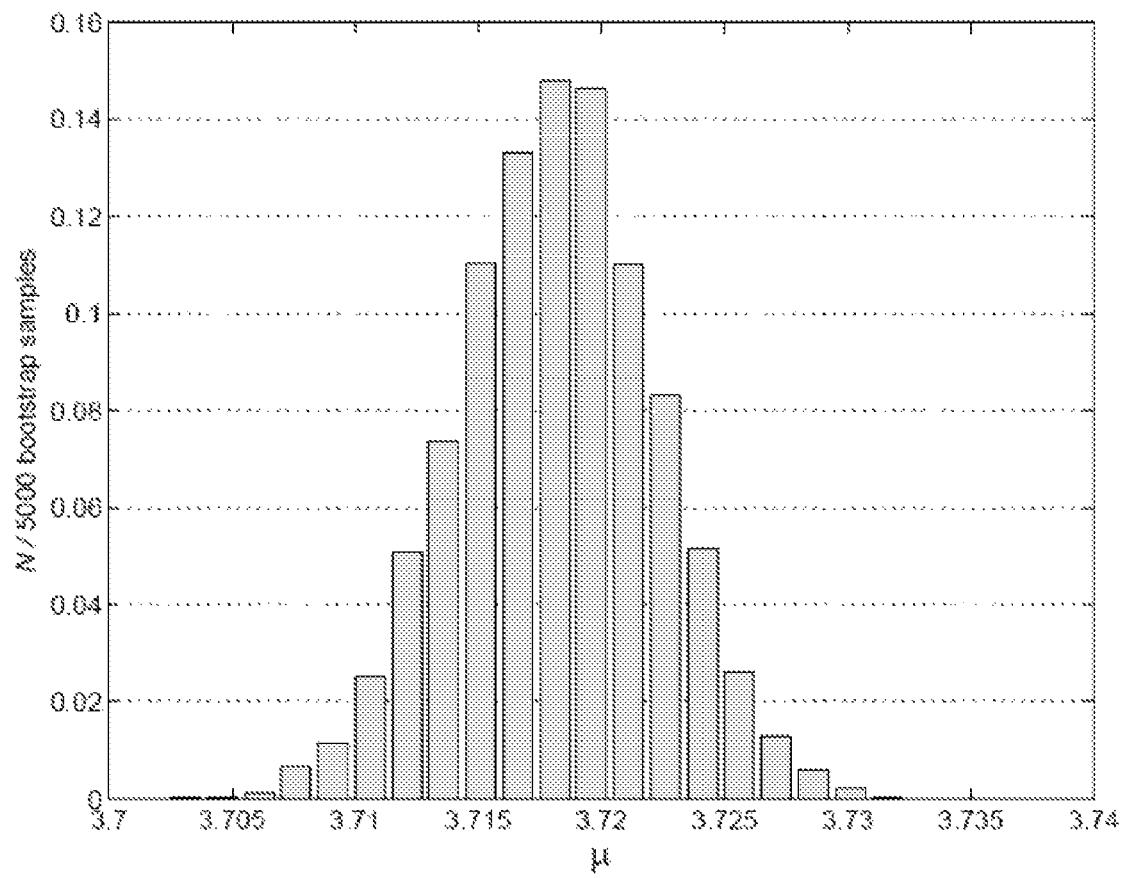
FIG. 16 is a statistical bootstrap histogram of mean compression ratios derived from random resampling of the data.

FIG. 16 is a statistical bootstrap histogram of mean compression ratios derived from random re-sampling of the data. Plotted in FIG. 16 is a normalized histogram of the compression ratios derived from the adaptive clustering compression algorithm applied to AIRS L1A global data from 8 Nov. 2005. The mode of the distribution is 3.70 to 1, with the mean slightly higher (3.72) due to the positive skew evident in the results. A small number of cases had compression ratios less than 3.6, the minimum being 3.46. However, 90% of the cases had compression ratios between 3.61 and 3.80.

The present invention provides an exposition of the lossless compression method developed for the AIRS digital counts. The previous description provides the motivation for using the approach of the present invention, which combines the advantages of a clustering with linear modeling. The attached Figures present a number of visualizations, which help clarify why the approach of the present invention is particularly effective on this data set. The compression algorithm was empirically demonstrated to achieve a substantial compression ratio on the order of 3.7 to 1. The technique is continuing to undergo refinement and further development.

Figure 17:
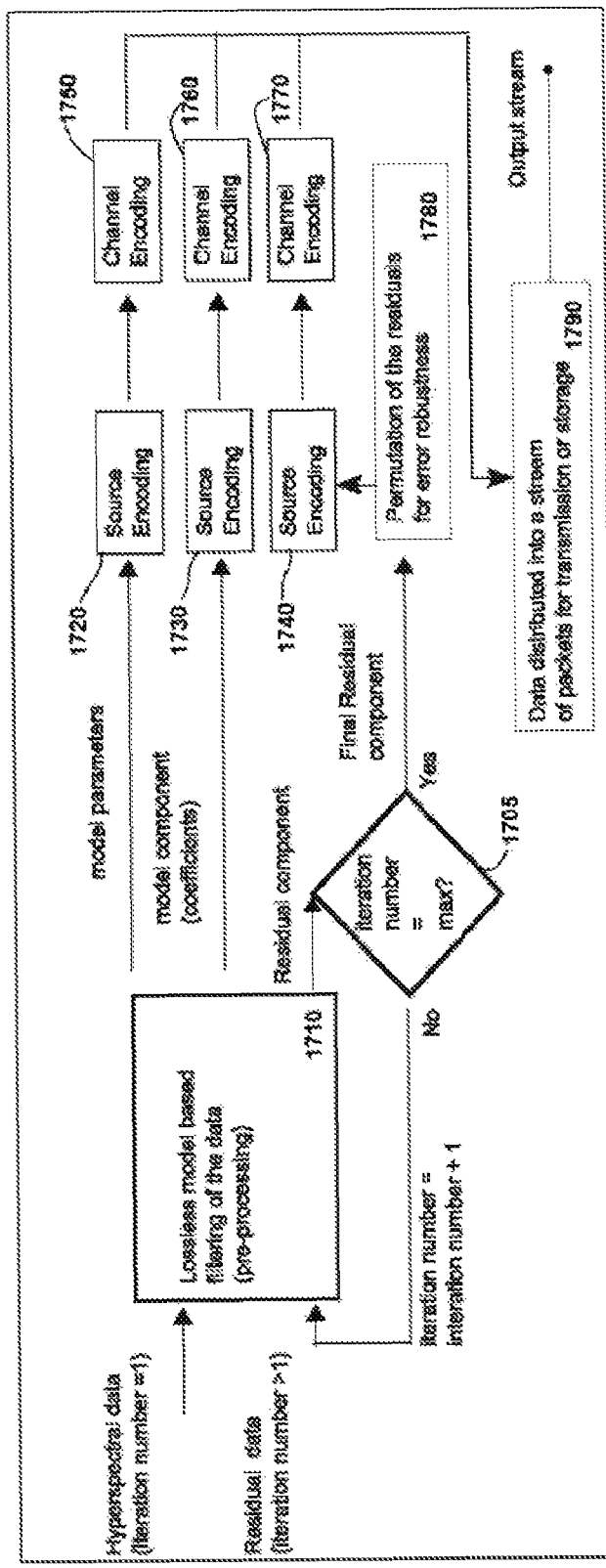
FIG. 17 is a block diagram of the algorithm of the present invention.

FIG. 17 is a block diagram of the algorithm of the present invention. Block 1710 represents the lossless model. This module separates input data into three output components, as will be described in more detail in connection with FIG. 18. Output components are bit streams representing: (1) the model parameters; (2) model coefficients; and (3) residuals. The output stream of residuals may be reprocessed (multiple times) by sending them back through the input of 1710 in order to separate any dependencies in the data not captured by previous passes. Encoding of output parameters streams (1) and (2), and final residuals (3) are performed independently by source (1720,1730,1740) and channel (1750, 1760, 1770) encoding schemes.

In block 1705, the residual data is reprocessed for some number of iterations in order to minimize any dependencies in the stream of data. In the embodiment represented in FIG. 17, this is a fixed number of times (labeled 'max' in the diagram). In other embodiments, a variable number of iterations may be used, within the spirit and scope of the present invention. The iteration number is initialized to 0. Each time the residuals pass through block 1710 the iteration number is incremented by 1. If the iteration number is less than 'max' then the residuals are input back into 1710 for further modeling and filtering. When the iteration number reaches 'max' the residuals are sent to 1780, 1740, 1770, 1790 to be encoded and output.

Block 1720 includes the source encoding of model parameters. The model parameter stream comprises the global parameters of the piece-wise model needed to encode the entire block of data being compressed. Example parameters include the number of clusters, the local dimensionality, the local coordinates, assignment maps, and labeling of outliers. These parameters describe the format of the data model. This format description is essentially a file header that may be protected from errors in order to reconstruct the file.

Block 1730 includes the source encoding of model coefficients. The model component (coefficients) includes the coefficients describing the best-fit of the model specified by the model parameter stream, to the data. For example, when the model describes hyperspectral footprints, one for each spatial location, the coefficients form a set of two-dimensional images. Spatial correlations present in this data may be addressed with conventional 2D image compression algorithms such as tiff, png, jpeg2000, or the like.

Block 1740 includes source encoding of final residuals. Final residuals represent an approximation of stochastic part of the data. It is assumed that the previous steps have removed most dependencies in the stream of data, hence any type of high performance stream encoder such as Huffman, arithmetic, or LZW may have similar performance in terms of the compression ratio. Blocks 1750, 1760, and 1770 include channel coding, which provides the primary robustness from error. Any form of forward error-correction code (FEC) may be used. Examples include Turbo product codes (TPC) and Low Density Parity Checks (LDPC). Blocks 1750, 1760, and 1770 are only present when the algorithm is used with the error robust option. The strength of the FEC is chosen to suit the each data stream from 1720, 1730 and 1740 and a target compression ratio.

Block 1750 includes channel encoding of model parameters. This data is extremely sensitive to errors—any single bit flip in the part of the compressed file that contains the model parameters will result in severe error degradation of the reconstructed hyperspectral image. As a result a very strong level of FEC is used on this stream. This has little effect on the overall compression because this stream has a relatively very small (negligible). Block 1760 includes channel encoding of model parameters (coefficients). Each coefficient impacts a set of measurements, for example, all the measurements in a footprint. As a result a strong FEC code may be used; however it need not be as strong as that needed for 1750. The increase in the compressed data size due to the error protection need not be large. This data still represents a relatively small part of the overall data size but is not negligible.

Block 1770 includes channel encoding of final residuals. Errors in the residuals will directly effect the reconstruction of only one measurement and may not affect scientific derived products (such as temperature or moisture retrievals) at all. As a result weaker FEC code is used in the error-robust option of the algorithm. In block 1780, final residuals are subjected to a permutation before they are encoded, packetized and transmitted. This procedure puts the spatial/spectral neighbors far from each other and mitigates the impact of "lost blocks" in the reconstructed image. In block 1790, data is distributed into a stream of packets for transmission or storage. The data is organized into packets for transmission. The format and size of the packets are determined by the specification of the hardware layer. For example, if transmitted over the Internet, they are divided into IPv4 packets.

Figure 18:
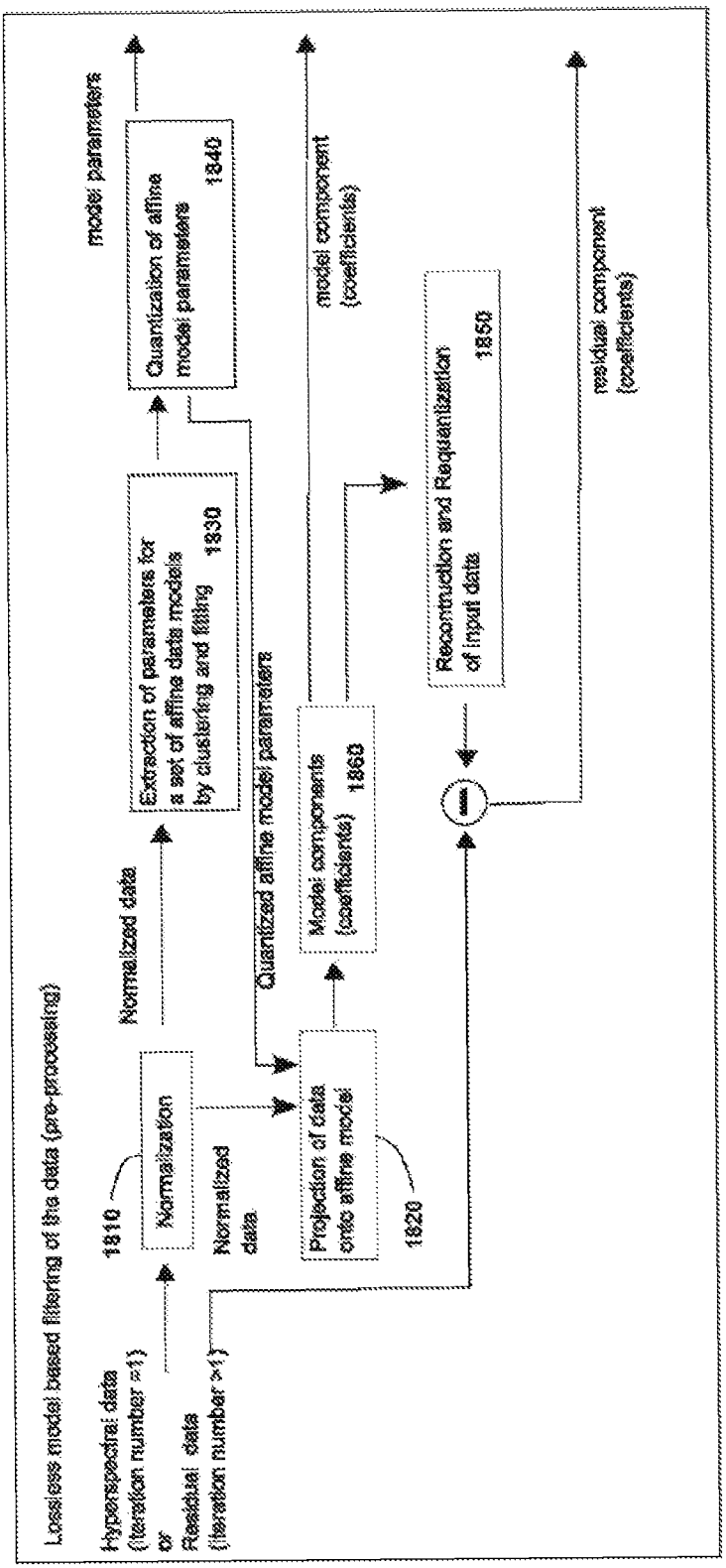
FIG. 18 is a block diagram of the lossless compression block 1710 of FIG. 17.

FIG. 18 is a block diagram of the lossless compression block 1710 of FIG. 17. Referring to FIG. 18, element 10 is the normalization block. A norm for feature vectors is computed. Each feature vector is projected onto the unit sphere by dividing by the vector norm. The (quantized) norms of the feature vectors are one constituent of the model components (coefficients). Block 1820 includes projection of data onto an affine model. Once a local coordinate system and an assignment map is determined by the block 1830, the data is projected onto the local coordinate systems determined by the assignment map. This projection is a model fit, which yields one constituent of the model components (coefficients) after quantization.

Block 1830 includes extraction of parameters for a set of affine data models by clustering and fitting. This block may be viewed as a version of the K-means cluster algorithm for hyperplane, as previously described. It outputs cluster assignment map, local coordinate system for each cluster, and set of outliers. Block 1840 includes quantization of affine model parameters. These parameters are initially computed as floating point numbers. They are quantized in this block in order to be stored and/or source coded. Block 850 includes reconstruction and re-quantization of input data. A reconstruction of the model parameters and quantized model components stream is used to reconstruct the original data as a piecewise smooth approximation. To achieve lossless compression all information is preserved by the residual errors between the approximation and the original data. The result is a stream of residuals. Block 1860 includes quantization of model components. The model components are initially computed as floating point numbers. They are quantized in this block in order to be stored and/or source coded.

Figure 19:
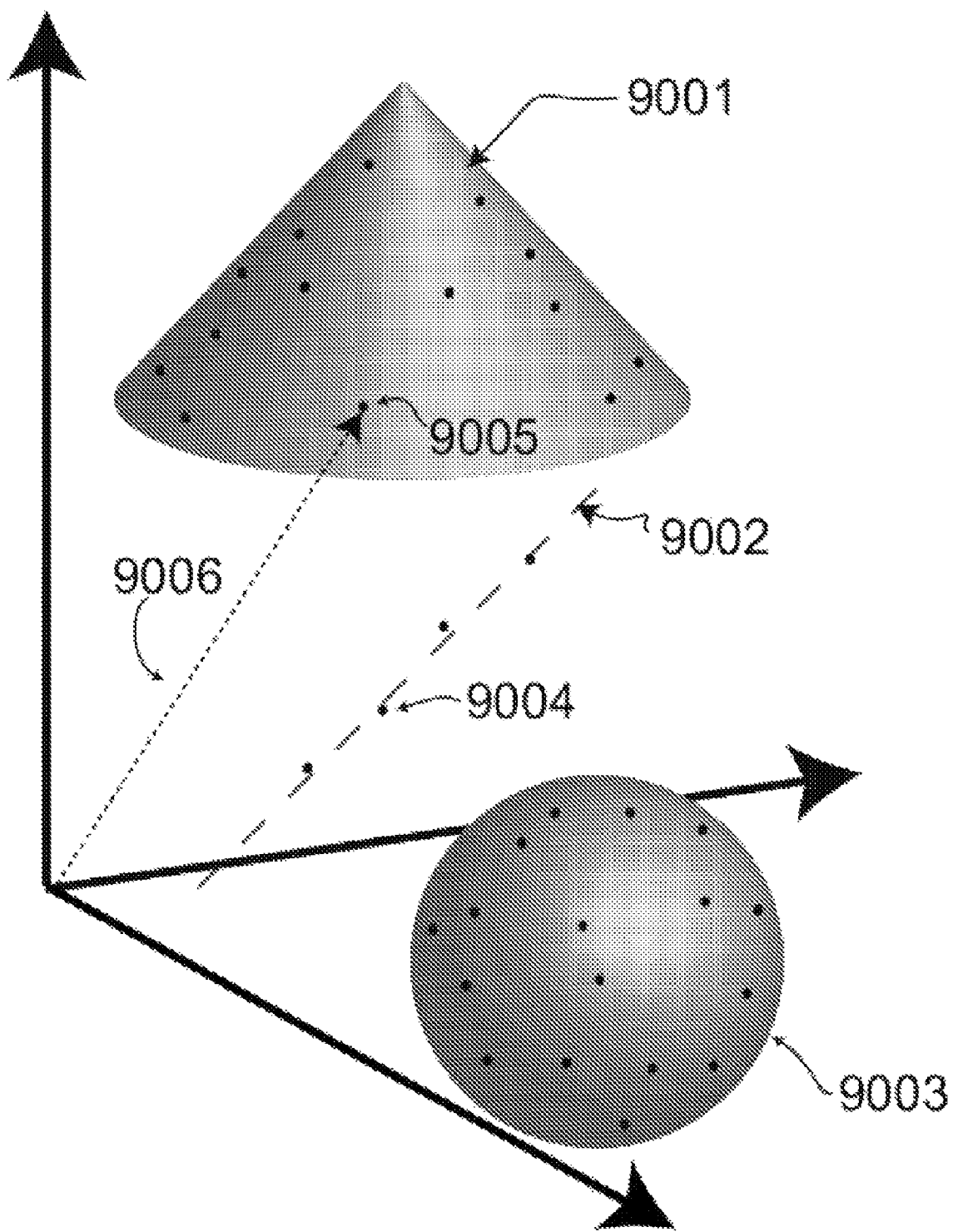
FIG. 19 is a diagram illustrating the concept of data elements, models, model coefficients, and residuals, in a simplified embodiment for the purposes of illustration.

FIG. 19 is a diagram illustrating the concept of data elements, models, model coefficients, and residuals, in a simplified embodiment for the purposes of illustration. The specific examples cited above relate to the use of hyper-spectral data, which may comprise a large number of values, or elements, for each data point. Visualizing these with relationship to a model and model coefficients may be difficult. Thus, for purposes of illustration, in the example of FIG. 19, we assume a three-dimensional model, which may be readily visualized.

It should be noted that the present invention operates on groups of data elements (i.e., feature vectors), which as noted above, in the preferred embodiment, may comprise multiple data values for a given point. However, other methods of grouping data points may be employed within the spirit and scope of the present invention. The system may operate on blocks of data (i.e., sub-portions of data) rather then data elements. These sub-portions need not be rectangular blocks but they are some partitioning of the individual data elements into subsets which are (A) Disjoint (empty intersection); (B) The union of the all the subsets is the set of all data elements; and/or (C) These subsets are comparable in that there is a similarity measure which describes how far two subsets are from each other.

In the preferred embodiment, the subsets are spectral footprints. That is they represent for a specific direction looking at the earth, the digital radiance counts in each of 1501 spectral bands. There are 90×135=12150 such views in a granule (a data set) so there are \we have 12150 subsets each consisting of 1501 data elements. As noted above, visualizing a model with thousands of dimensions is difficult. Thus, for the purposes of illustrating the method of the present invention, in FIG. 19, a three-dimensional model is shown.

The grouping or clustering is of collections of these subsets. That is, those subsets which are similar enough to be described by a single model are identified. In the preferred embodiment each subset of 1501 data elements is written as a tuple of 1501 numbers and mathematically treated as a vector in a 1501-dimensional vector space. The vectors tend to lie along a collection of lines, in this specific case. In general the preferred embodiment covers a case where these vectors lie along a set of models. The grouping referred to in the clustering is which model the points go with.

FIG. 19 illustrates this concept in simplified form. In this example, suppose the data consists of a 35×3=105 data elements (numbers). The data is partitioned into 35 subsets, each subset a tuple of 3-numbers. In this illustration, (x,y,z), for example the data points are represented as black dots, such as point 9005. It may also be considered a vector 9006. Hence three data elements now make up a single vector. In this illustration, the clustering algorithm would notice that the vectors could be split into three groups, each according to a different model, such as a cone 9001, a line 9002, and a sphere 9003. These particular models are by way of illustration only and are in no way limiting of the present invention.

The parameters of those models such as the height, direction, offset, and radius of the cone, the direction and offset of the line, the center and radius of the sphere and any other global information on formatting of the data, are what are called the model parameter stream. The coefficients would be the label that says that point 9005 is on the cone model, and point 9004 is on the line, along with coordinates for 9005 specifying which point on the cone (an angle and a height) and a coordinate for the point 9004 (a single number) specifying which point it is on the line. Thus, data can be reduced to a model and a model coefficient. The data can be transmitted as a model value (which may already be stored in a receiving system) and a coefficient. A receiving system may take the coefficient value and then apply this to the model, and then reconstruct the data as a three-dimensional point from that model. This is, of course, a simplified example, and in application, the dimensions of the model may be much greater.

It also should be noted that the data point may not fall exactly on the model, which is illustrated clearly by line model 9002. In that model, point 9004 is near line 9002, but not on the line. If the model (line 9002) and coefficients (point on line 9002 nearest point 9004) are transmitted, the data may be compressed, but the accuracy of the reconstructed data is not precise, or in other words, is lossy. This mode of operation may be useful for some forms of data transmission. However, for transmission of scientific data, such as hyper-spectral data, a lossless compression technique may be employed.

For data vectors that do not lie exactly on the model, an error value (residuals) is calculated for each data element (the error in each component of the tuple). This residual value represents the difference between the nearest model value and the actual data vector value. At a receiving system, if the data model, data coefficients, and residuals are known, the original data vector or value can be reconstructed accurately, in a lossless manner. The residual values may be compressed for transmission, to reduce the overall size of the data being transmitted. In terms of reconstructing the data, it is most important to define the model accurately, then the coefficients, and then the residuals, in that order of compression or transmission loss. Thus, the level of error correction for the residual values need not be as strong as the coefficient values in order to reconstruct the data accurately.

Figure 20:
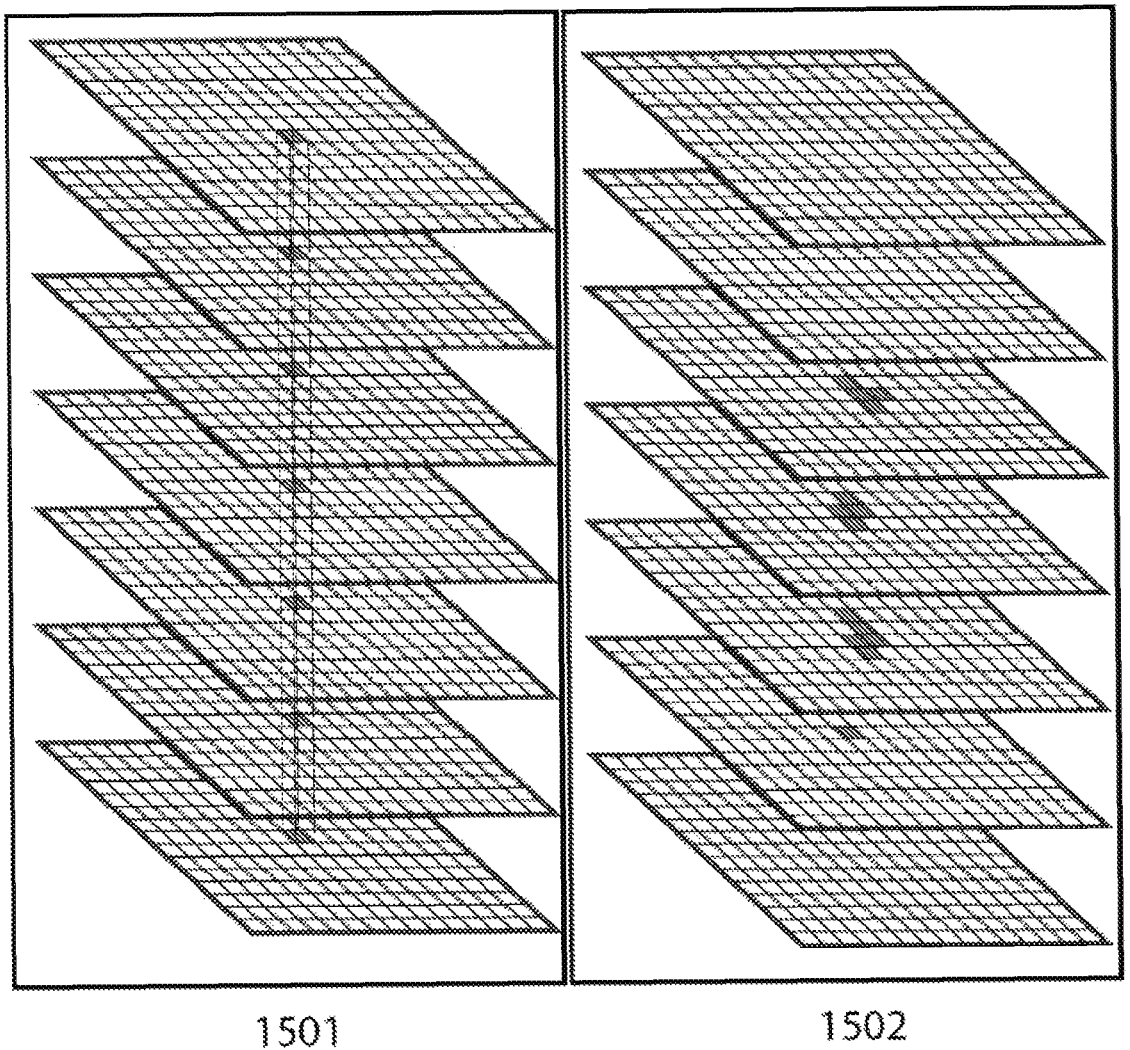
FIG. 20 contains illustrations of sub-portions of the data multi-spectral data cube for two embodiments of the present invention.

FIG. 20 contains illustrations of sub-portions of the data multi-spectral data cube for two embodiments of the present invention. Diagram 1501 is an illustration of a sub-portion of the data multi-spectral data cube, used in one embodiment of the invention, whose values are fit to a model. Each horizontal plane in diagram 1501 corresponds to a spectral band. In a plane, each of the 2D array of pixels represents a single field of view measured in that band. For each square in diagram 1501, a numerical value (digital count) is measured in each granule. The vertical grouping represents a collection of pixels corresponding to a single field of view (footprint), but different spectral bands. In one embodiment of the invention the sub-portion of the data corresponding to set of the tuples of values at each footprint is modeled.

Diagram 1502 of FIG. 20 is an illustration of a sub-portion of the data used for another embodiment of the data. Whereas in element 1501, the data was divided into vertical "blocks" allowing the model to capture spectral dependencies, in this embodiment, the sub-portions may extend both spatially and spectrally.

Figure 21:
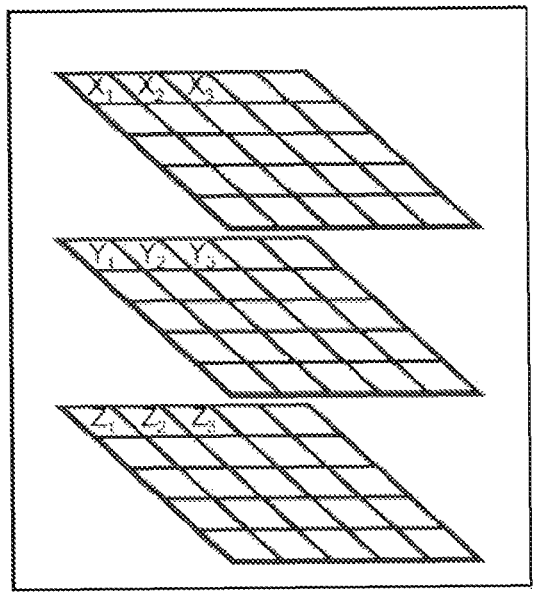
FIG. 21 contains a an illustration of the a sub-portion of the data used in one embodiment of the invention, whose values are fit to a model, along with an illustration of the mapping of values at sub-portions of the data into a space.
Figure 21:
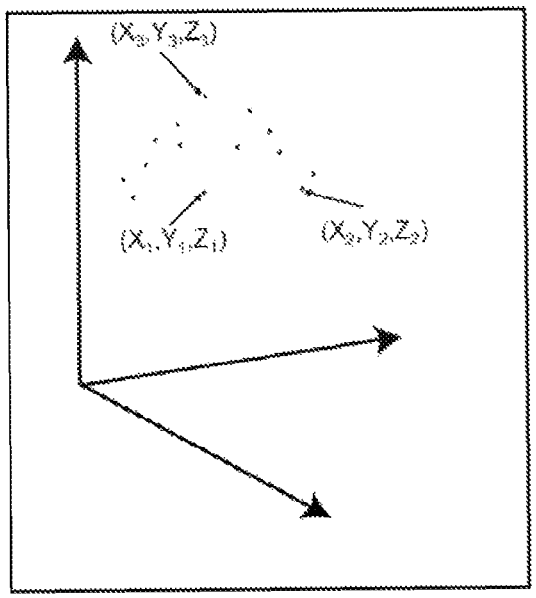

FIG. 21 contains a an illustration of the a sub-portion of the data used in one embodiment of the invention, whose values are fit to a model, along with an illustration of the mapping of values at sub-portions of the data into a space. Referring to FIG. 21, diagram 1101 illustrates the a sub-portion of the data used in one embodiment of the invention, whose values are fit to a model. For simplicity, three bands are represented here, corresponding to the variables X, Y, and Z. As an example the variables X, Y, and Z could represent the CIE XYZ color bands, RGB or YUV. In actual implementation of the present invention using hyper-spectral data, thousands of bands may be used. The indexes in diagram 1101 represent footprints, that is, pixels that share the same index corresponded to the same field of view but different bands. Diagram 11002 in FIG. 21 illustrates the mapping of values at sub-portions of the data into a space. In one embodiment, the values of digital counts corresponding to each footprint such as (X_1, Y_1, Z_1) represent a point in a data space.

Figure 22:
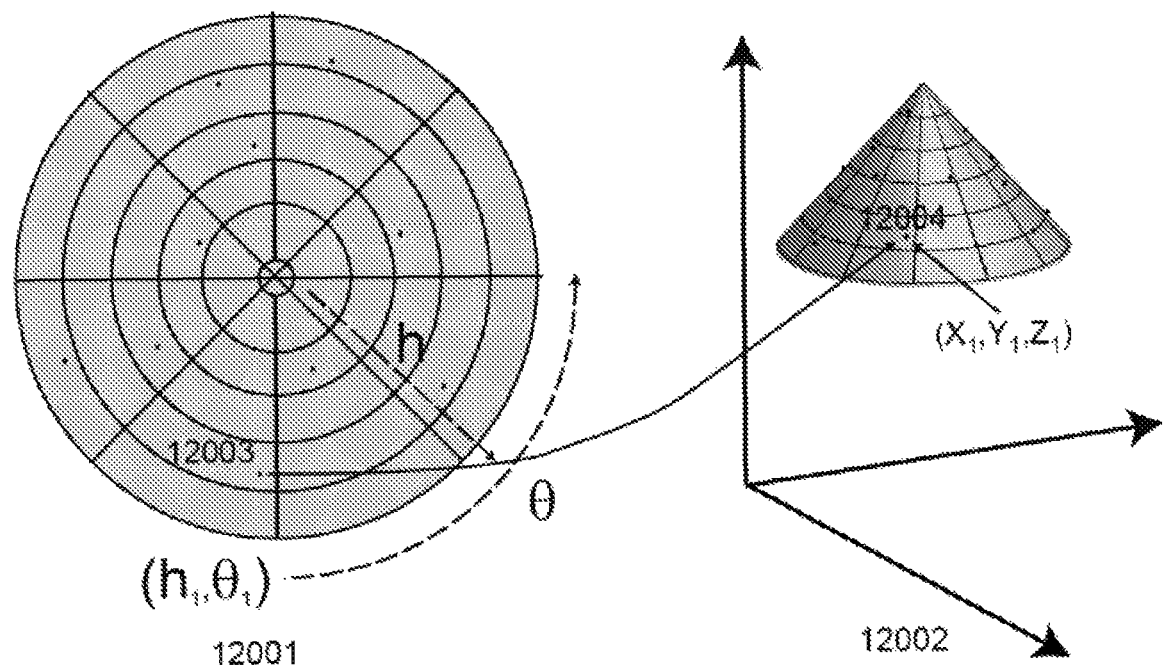
FIG. 22 includes an illustration of an example of coordinates parameterizing a mathematical model of the data, along with an illustration of coordinates mapping into the data space.

FIG. 22 includes an illustration of an example of coordinates parameterizing a mathematical model of the data, along with an illustration of coordinates mapping into the data space. Referring to FIG. 22, diagram 12001 is an illustration of an example of coordinates parameterizing a mathematical model of the data. In diagram 12001, the parameter h represents the distance from the origin and the parameter theta represents the angle counter clockwise from the x axis. Diagram 12002 is an illustration of coordinates mapping into the data space. The coordinates map the point (h_1, theta_1) to a point in data-space (X_1, Y_1, Z_1). If data points (X,Y,Z) lie along the model, as in this example, they can be parameterized by two variables rather than three. This represents one component of compression as used in the present invention. However, in many instances, the data points are not likely to reside exactly on a model surface. In a lossy compression mode, the data points can be approximated by the nearest point on the model surface, and thus highly compressed. However, for lossless compression, a further component may be required.

Figure 23:
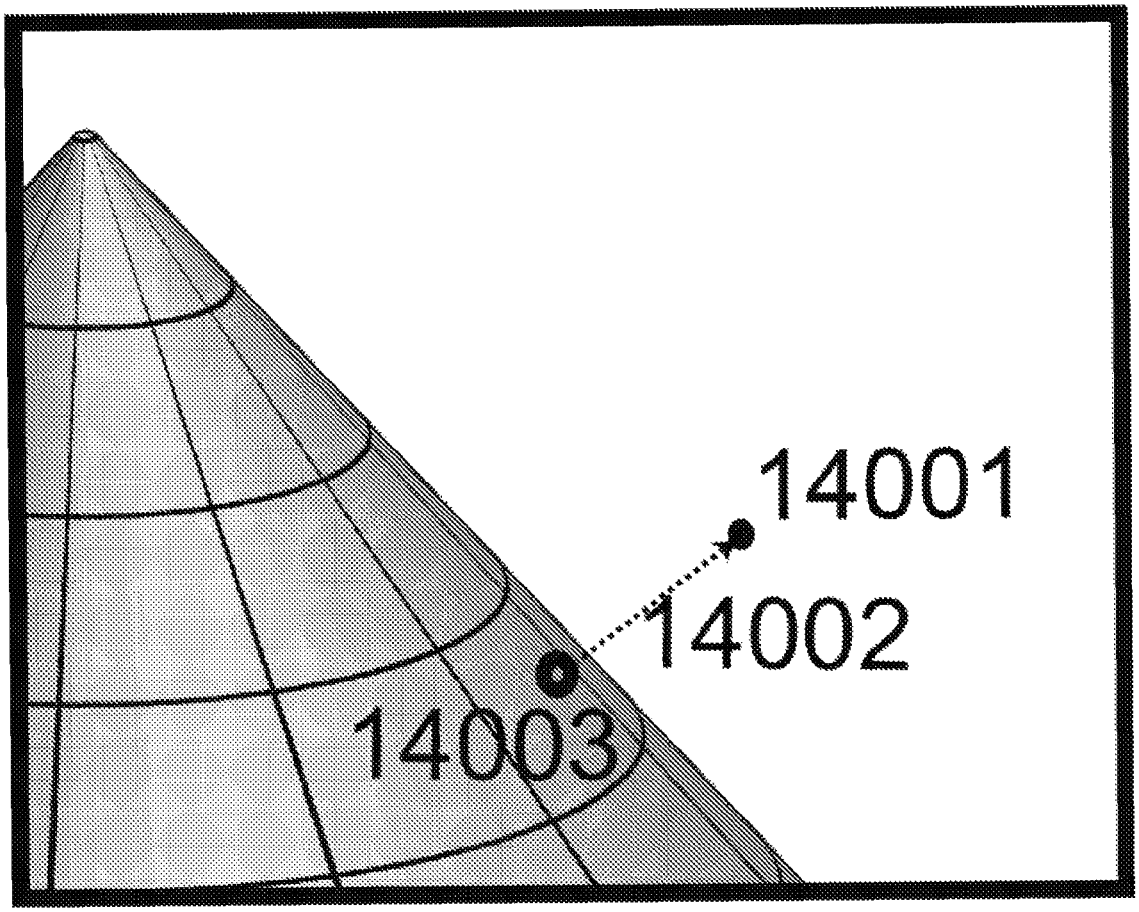
FIG. 23 is a diagram illustrating a close-up of a model surface with data points.

FIG. 23 is a diagram illustrating a close-up of a model surface with data points. As illustrated in FIG. 23, an arbitrary data point, specified by a sub-portion of the data, 14001, may typically lie near but not the model which is fit to a cluster of similar points. The projection of the data point 14001 onto model is illustrated as point 14003. This point can be represented exactly by coordinates in the model, and thus efficiently (although not accurately) compressed. More specifically, point 14003 represents a projection that is quantized (in data space). The difference between the data point 14001 and the quantized projection is a residual value 14002. If the combination of the model, the model coefficients (the position 14003) and the residual value 14002 can be transmitted, the original data point 14001 can be efficiently compressed in a lossless manner.

Since the present invention determines a set of models that are close to the data points, the residuals are, in general, small. When the algorithm is operated in lossy mode, and the residuals are considered sufficiently close to the model, the residuals may be disregarded. When it is operated in lossless mode, the residuals are preserved. The residuals have the same dimension as the data points and are equal in number. Thus, the uncompressed file size of the residuals may be identical to the original data if they are represented in the same way. However, since the residuals are small in magnitude, they compress well using a typical arithmetic or entropy encoder.

While the preferred embodiment and various alternative embodiments of the invention have been disclosed and described in detail herein, it may be apparent to those skilled in the art that various changes in form and detail may be made therein without departing from the spirit and scope thereof.

We claim:

1. A method of selectively compressing a stream of input data elements from signal and data processing electronics to produce a selectively lossy to a very high level of lossless output data stream for transmission over a data network, the method comprising the steps of:

(a) selecting at the signal and data processing electronics, at least one mathematical model, from a set of predetermined mathematical models, each mathematical model parameterizing a space with a set of model specific coordinates, the coordinates represented by a tuple of at least one coordinate value, and outputting for each selected mathematical model, a set of parameters comprising a map, from a tuple of coordinate values in the model space to an approximating set of data values for at least one subportion of the input data elements, (b) compressing the stream of input elements by determining, at the signal and data processing electronics, for at least one subportion of the input data elements, a mathematical model label indicating a selected mathematical model, and the values of a tuple of model coordinates which map to a tuple of data values which, according to a measure of merit, best approximate the subportion of the input data elements, and (c) outputting, over the data network, at least the mathematical model label and parameters as at least a portion of an output data stream, wherein the mathematical model parameters comprises a lossy compressed portion of the stream of input data elements.

2. The method of claim 1, further comprising the step of:
(d) computing, at the signal and data processing electronics, differences between mathematical model representations for a selected mathematical model and the corresponding subportion of data elements as residuals, and outputting the residuals as a portion of the output data stream over the network to provide a high level of lossless output data stream.

3. The method of claim 2, further comprising the step of: error encoding, at the signal and data processing electronics, the model parameters prior to outputting to the network the mathematical model label, and model parameters, and residuals as a portion of the output data stream without significantly increasing bandwidth of the output data stream.

4. The method of claim 1, wherein the step of selecting at the signal and data processing electronics, at least one mathematical model, further comprises the step of:
selecting, at the signal and data processing electronics at least two mathematical models by first clustering into groups, a set of tuples of data values, wherein each tuple of values corresponds to a subportion of the data elements.

5. The method of claim 2, further comprising the step of: iteratively processing the residuals through steps (a)-(d) at the signal and data processing electronics to further compress the input data into additional mathematical model labels and corresponding parameters and producing new residuals.

6. The method of claim 5, further comprising the step of: applying, at the signal and data processing electronics, a transformation to the input data before applying step (a).

7. The method of claim 1, further comprising the step of: applying, at the signal and data processing electronics, an objective function (measure of merit) to quantify a fit between the input data elements and the piecewise mathematical model parameters.

8. The method of claim 7, wherein the step of applying, at the signal and data processing electronics, an objective function (measure of merit) to quantify a fit between the input data elements and the piecewise mathematical model parameters comprises the step of:
using a mean the sum of squared errors, at the signal and data processing electronics, to quantify the fit between the input data elements and the piecewise mathematical model parameters.

9. The method of claim 7, wherein the step of applying, at the signal and data processing electronics, an objective function (measure of merit) to quantify a fit between the input data elements and the piecewise mathematical model parameters comprises the step of:
using mean sum of absolute distances, at the signal and data processing electronics, to quantify the fit between the data and the piecewise mathematical model parameters.

10. The method of claim 7, wherein the step of applying, at the signal and data processing electronics, an objective function (measure of merit) to quantify a fit between the input data elements and the piecewise mathematical model parameters comprises the step of:
using mean entropy of the residuals, at the signal and data processing electronics, to quantify the fit between the data and the piecewise mathematical model parameters.

11. The method of claim 7, wherein the step of applying, at the signal and data processing electronics, an objective function (measure of merit) to quantify a fit between the input data elements and the piecewise mathematical model parameters comprises the step of:
using a non-linear optimization of the model coefficients, at the signal and data processing electronics, to quantify the fit between the data and the piecewise mathematical model parameters to minimize the objective function.

12. The method of claim 7, wherein the step of applying, at the signal and data processing electronics, an objective function (measure of merit) to quantify a fit between the input data elements and the piecewise mathematical model parameters comprises the step of:
using a randomized search of the optimal model coefficients, at the signal and data processing electronics, to quantify the fit between the data and the piecewise mathematical model parameters to minimize the objective function.

13. The method of claim 7, wherein the step of applying, at the signal and data processing electronics, an objective function (measure of merit) to quantify a fit between the input data elements and the piecewise mathematical model parameters comprises the step of:
using a brute force search for the optimal model coefficients, at the signal and data processing electronics, to quantify the fit between the data and the piecewise mathematical model parameters to minimize the objective function.

14. The method of claim 7, wherein the step of applying, at the signal and data processing electronics, an objective function (measure of merit) to quantify a fit between the input data elements and the piecewise mathematical model parameters comprises the step of:
using a gradient decent search, at the signal and data processing electronics, to quantify the fit between the data and the piecewise mathematical model parameters for the optimal parameters of the objective function.

15. The method of claim 7, wherein the step of applying, at the signal and data processing electronics, an objective function (measure of merit) to quantify a fit between the input data elements and the piecewise mathematical model parameters comprises the step of:
using a linear least squares minimization, at the signal and data processing electronics, between the data and the mathematical model to quantify the fit between the data and the piecewise mathematical model parameters.

16. The method of claim 4, wherein the signal and data processing electronics is located within a Hyperspectral Grating Spectrometer and the stream of input data elements comprises remotely sensed hyperspectral data, and the step of clustering the input data elements into groups of data elements so that each subportion of data elements can be represented compactly by one of a set of predetermined mathematical models comprises the step of clustering the hyperspectral data into a hyperspectral data cube.

17. The method of claim 3, wherein the step of error encoding, at the signal and data processing electronics the model parameters, prior to outputting the mathematical model, model parameters, and residuals as a portion of the output data stream comprises the step of:
   independently encoding the model parameters and residuals by channel encoding at the signal and data processing electronics.

18. The method of claim 17, wherein the step of channel coding at the signal and data processing electronics comprises forward error-correction coding.

19. The method of claim 18, wherein the model parameters are channel encoded at the signal and data processing electronics using a first, very strong level of forward error-correction to provide robustness from error with a negligible effect on compression.

20. The method of claim 19, wherein the model-parameters are channel encoded at the signal and data processing electronics using a second, strong level of forward error-correction, less strong than the first, very strong level of error correction to provide robustness from error with a negligible effect on compression.

21. The method of claim 19, wherein the residuals are channel encoded at the signal and data processing electronics using a third, weak level of forward error-correction, less strong than the second, strong level of error correction, as error in the final residuals has a negligible effect on a reconstructed data stream.

22. A method for compressing a stream of input data elements from signal and data processing electronics to produce an output lossless data stream for transmission over a data network, the method comprising the steps of:
   compressing the stream of input data elements by selecting at the signal and data processing electronics, a mathematical model which most closely represents the stream of input data elements and outputting a label indicating a selected mathematical model and a set of mathematical model parameters defining the input data elements relative to the selected mathematical model;
   calculating a difference between the selected mathematical model and the input data stream and outputting the difference as residual data elements;
   outputting, over the data network, the mathematical model label, the mathematical model parameters, and the residual data elements as a lossless compressed data stream.

23. The method of claim 22, further comprising the step of:
   error encoding, at the signal and data processing electronics, the mathematical model parameters prior to outputting to the network the mathematical model label, parameters, and residuals as a portion of the output data stream, in order to provide error robustness for the output data stream without significantly increasing bandwidth of the output data stream.

* * * * *